United States Patent
Iwase et al.

(10) Patent No.: US 7,594,309 B2
(45) Date of Patent: Sep. 29, 2009

(54) METHOD OF PRODUCING LAMINATE-TYPE PIEZOELECTRIC ELEMENT

(75) Inventors: Akio Iwase, Nishio (JP); Shige Kadotani, Aichi-pref (JP); Tetsuji Itou, Kariya (JP)

(73) Assignee: Denso Corporation, Kariya, Aichi-Pref. (JP)

( * ) Notice: Subject to any disclaimer, the term of this patent is extended or adjusted under 35 U.S.C. 154(b) by 350 days.

(21) Appl. No.: 11/606,356

(22) Filed: Nov. 30, 2006

(65) Prior Publication Data

US 2007/0124903 A1    Jun. 7, 2007

(30) Foreign Application Priority Data

Dec. 1, 2005    (JP)    ............... 2005-348269

(51) Int. Cl.
  *H01L 41/22*    (2006.01)
  *H02N 2/00*    (2006.01)

(52) U.S. Cl. ............... 29/25.35; 29/25.42; 29/609; 29/831; 29/832; 29/837; 310/328; 310/311

(58) Field of Classification Search ............... 29/25.35, 29/25.42, 609, 830, 831, 832, 837, 845; 310/328, 310/311, 313 A, 366, 367
  See application file for complete search history.

(56) References Cited

U.S. PATENT DOCUMENTS 6,104,129 A * 8/2000 Okamoto ............... 310/366
6,414,417 B1 * 7/2002 Tsuyoshi et al. ............ 310/366
6,522,052 B2 * 2/2003 Kihara et al. ............... 310/366

FOREIGN PATENT DOCUMENTS

| JP | 6-252469 | 9/1994 |
| JP | 8-274381 | 10/1996 |
| JP | 2001-135872 | 5/2001 |
| JP | 2001-210886 | 8/2001 |
| JP | 2001-267646 | 9/2001 |

\* cited by examiner

*Primary Examiner*—Derris H. Banks
*Assistant Examiner*—Tai Nguyen
(74) *Attorney, Agent, or Firm*—Nixon & Vanderhye PC

(57) ABSTRACT

A method of producing a laminate-type piezoelectric element, wherein a ceramic laminated body therein is formed through an intermediate laminated body-forming step of forming an intermediate laminated body 100 by alternately laminating green sheets 110 that serve as the piezoelectric layers and the inner electrode layers 20, and a calcining step of forming the ceramic laminated body by calcining the intermediate laminated body 100. In the intermediate laminated body-forming step, an overlapped portion 108 and a non-overlapped portion 109 are formed in the intermediate laminated body 100, and voids 40 are formed, in advance, in at least part of the portion that becomes the non-overlapped portion 109. In the calcining step, relaxing layers including the voids 40 are formed.

7 Claims, 26 Drawing Sheets

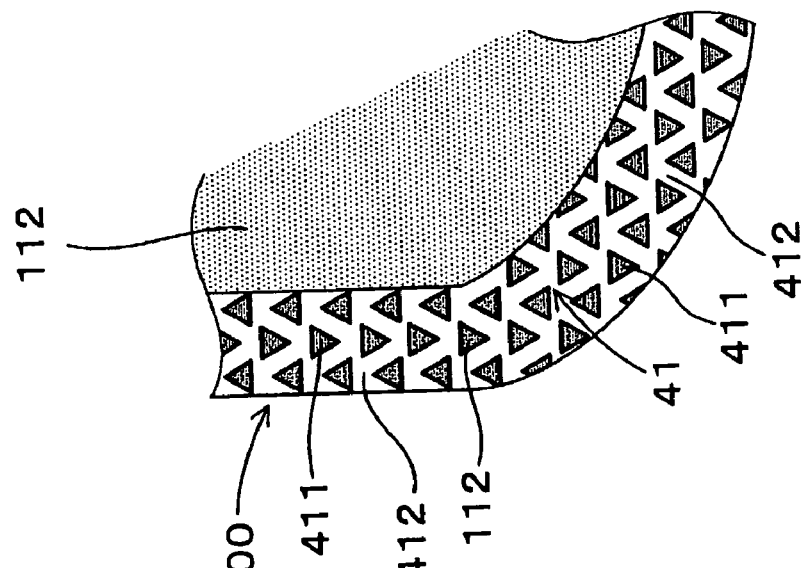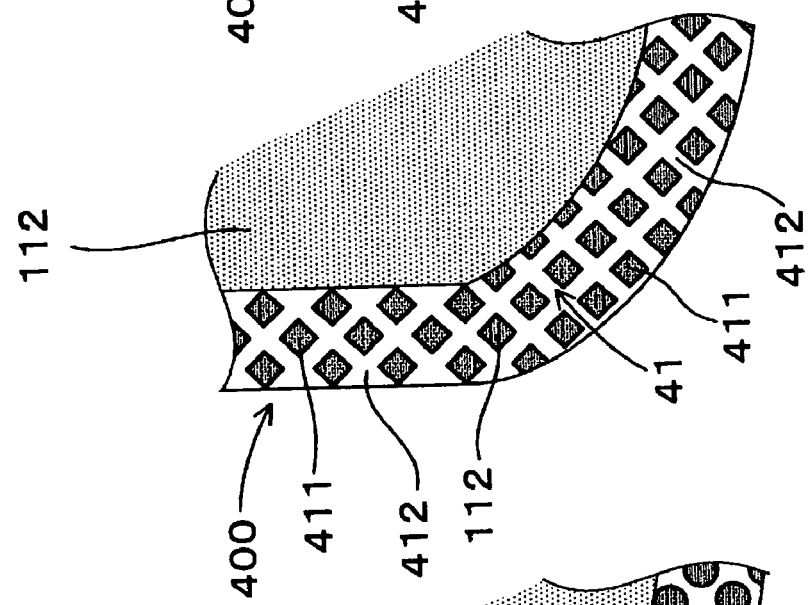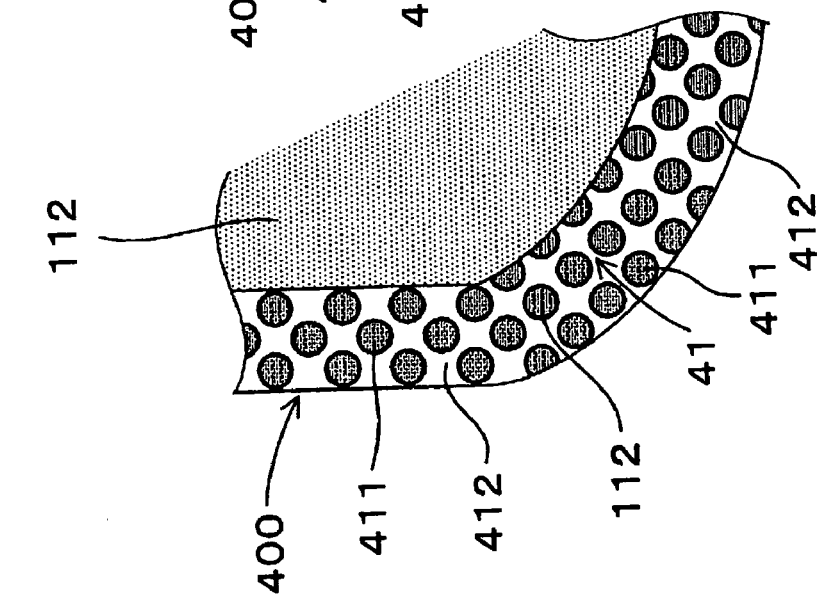

METHOD OF PRODUCING LAMINATE-TYPE PIEZOELECTRIC ELEMENT

TECHNICAL FIELD

The present invention relates to a method of producing a laminate-type piezoelectric element which can be applied to, for example, piezoelectric actuators and the like.

BACKGROUND ART

In recent years, injectors, for fuel injection for automobiles, using laminate-type piezoelectric elements have been developed from the standpoint of improving fuel efficiency, exhaust gas emission, etc. of automobiles.

The laminate-type piezoelectric element has a ceramic laminated body obtained by alternately laminating piezoelectric layers made of, for example, a piezoelectric material and inner electrode layers having electrically conducting property, and having outer electrodes joined to the side surfaces of the ceramic laminated body. When a voltage is applied across the inner electrode layers, the piezoelectric layers undergo a displacement to drive the laminate-type piezoelectric element.

Some laminate-type piezoelectric elements have a non-pole structure in which inner electrode layers are not formed on the side surfaces, on the other side in the ceramic laminated body, to enhance electric insulation on the outer circumferential surface of the ceramic laminated body (see Japanese unexamined patent publication No. 2001-135872).

When the ceramic laminated is viewed in the direction of lamination, however, the laminate-type piezoelectric element of the non-pole structure has an overlapped portion which is a region where the inner electrode layers are all overlapped one upon the other and a non-overlapped portion which is a region where only some of the inner electrode layers are overlapped or none of them are overlapped. The non-overlapped portion does not undergo piezoelectric displacement and cannot be driven. Therefore, stress (strain) is concentrated in the non-overlapped portion depending upon the piezoelectric displacement, and cracks may occur in the ceramic laminated body. Also, there may occur an inconvenience such as an insulation breakdown.

In order to solve the above problem, Japanese unexamined patent publication No. 8-274381 and Japanese unexamined patent publication No. 2001-267646 propose structures, for laminate-type piezoelectric elements, provided with stress relaxing portions (stress relaxing layers) among the inner electrodes to relax the stress. However, the stress relaxing portions in the above patent publications are filled with, for example, fine lead titanate particles which may migrate upon being repetitively driven and may be detrimental to the performance of the piezoelectric element.

Japanese unexamined patent publication No. 2001-210886 proposes a structure of a laminate-type piezoelectric element in which recessed grooves are formed in the ends of the inner electrodes by machining and are filled with an insulator or a conductor to impart the function of relaxing the stress. According to this patent publication, however, the recessed grooves are formed by machining which is not suited for mass production. Besides, cracks develop on the machined surfaces which may become a cause of an inconvenience such as an insulation breakdown.

It is therefore desired to provide a method, of producing a laminate-type piezoelectric element, which is capable of forming a structure for relaxing the stress caused by piezoelectric displacement by a simple method and is, further, capable of providing excellent durability and reliability by relying upon the stress-relaxing structure.

SUMMARY OF INVENTIONS

The present invention was accomplished in view of the above problems in the prior art and provides a method, of producing a laminate-type piezoelectric element, which is capable of easily forming a structure for effectively relaxing the stress caused by piezoelectric displacement and is, further, capable of providing excellent durability and reliability.

A first invention is concerned with a method of producing a laminate-type piezoelectric element having a ceramic laminated body obtained by alternately laminating piezoelectric layers made of a piezoelectric material and inner electrode layers having an electrically conducting property, and having outer electrodes arranged on the side surfaces of the ceramic laminated body, wherein the ceramic laminated body is formed through:

an intermediate laminated body-forming step of forming an intermediate laminated body by alternately laminating green sheets that serve as the piezoelectric layers and the inner electrode layers; and a calcining step of forming the ceramic laminated body by calcining the intermediate laminated body; and wherein, in the intermediate laminated body-forming step, there are formed an overlapped portion which is a region where the inner electrode layers are all overlapped one upon the other, and a non-overlapped portion which is a region where only some of the inner electrode layers are overlapped, or none of the inner electrode layers are overlapped at all when the intermediate laminated body is viewed in the direction of lamination, and voids are formed in advance in at least part of the non-overlapped portion, and in the calcining step, relaxing layers including the voids are formed.

In the method of producing a laminate-type piezoelectric element of the invention, voids are formed in advance in the non-overlapped portion of the intermediate laminated body in the intermediate laminated body-forming step. By forming voids in the intermediate laminated body, before being calcined, as described above, the voids continue to exist even after the calcining step. Thus, the relaxing layers including the voids are easily formed in the non-overlapped portion of the ceramic laminated body obtained after calcining. Owing to the voids that are included therein, the relaxing layers work to disperse and relax the stress caused by the piezoelectric displacement. That is, the structure for relaxing the stress is easily formed by the above production method.

In the production method of the invention, further, the relaxing layers are provided in the non-overlapped portion which is a portion that does not undergo piezoelectric displacement and cannot be driven. That is, the relaxing layers are provided in the non-overlapped portion where stress concentrates due to piezoelectric displacement. Therefore, the stress can be effectively dispersed and relaxed by the relaxing layers that include voids. This prevents stress from concentrating in the non-overlapped portion despite of piezoelectric displacement and suppresses the occurrence of cracks.

Owing to its excellent effect described above, the laminate-type piezoelectric element produced by the above production method maintains its high quality and performance even after used for extended periods of time. This accounts for its excellent durability and reliability.

According to the production method of the present invention as described above, a structure can be easily formed for relaxing the stress caused by the piezoelectric displacement.

The laminate-type piezoelectric element produced by the above production method exhibits excellent durability and reliability.

A second invention is concerned with a method of producing a laminate-type piezoelectric element having a ceramic laminated body obtained by alternately laminating piezoelectric layers made of a piezoelectric material and inner electrode layers having electrically conducting property, and having outer electrodes arranged on the side surfaces of the ceramic laminated body, wherein the ceramic laminated body is formed through:

an intermediate laminated body-forming step of forming an intermediate laminated body by alternately laminating green sheets that serve as the piezoelectric layers and the inner electrode layers; and a calcining step of forming the ceramic laminated body by calcining the intermediate laminated body; and wherein, in the intermediate laminated body-forming step, there are formed an overlapped portion which is a region where the inner electrode layers are all overlapped one upon the other, and a non-overlapped portion which is a region where only some of the inner electrode layers are overlapped, or none of the inner electrode layers are overlapped at all when the intermediate laminated body is viewed in the direction of lamination, and a material for forming relaxing layers is arranged on at least part of the non-overlapped portion, the material for forming relaxing layers having a calcining temperature lower than that of the green sheet and contracting greatly through the calcining step, and in the calcining step, relaxing layers including voids are formed by contracting the material for forming relaxing layers to an extent greater than that of the neighboring portions.

In the method of producing a laminate-type piezoelectric element of the invention, the material for forming relaxing layers is arranged in the non-overlapped portion of the intermediate laminated body in the intermediate laminated body-forming step. The material for forming the relaxing layers has a calcining temperature lower than that of the green sheet and, further, contracts more through the calcining step than the green sheet. By arranging the material for forming relaxing layers having the above-mentioned properties in the intermediate laminated body of before being calcined, the material for forming relaxing layers contracts more than the neighboring portions through the calcining in the above calcining step, and voids are formed therein. Thus, the relaxing layers including voids are easily formed in the non-overlapped portion of the ceramic laminated body obtained after calcining. That is, the structure for relaxing the stress caused by the piezoelectric displacement is easily formed by the above production method.

In the production method of the invention, the relaxing layers are provided in the non-overlapped portion like in the above first invention. Therefore, the stress caused by the piezoelectric displacement can be effectively dispersed and relaxed by the relaxing layers that include voids. This prevents stress from concentrating in the non-overlapped portion despite of piezoelectric displacement and suppresses the occurrence of cracks.

Owing to the excellent effects described above, the laminate-type piezoelectric element produced by the above production method maintains high quality and performance even after being used for extended periods of time. This accounts for its excellent durability and reliability.

According to the production method of the present invention as described above, the structure can be easily formed for relaxing the stress caused by the piezoelectric displacement. The laminate-type piezoelectric element produced by the above production method exhibits excellent durability and reliability.

BRIEF DESCRIPTION OF THE DRAWINGS

FIG. 3a shows a view illustrating non-printed portion-forming layers in Example 1.

FIG. 3b shows a view illustrating non-printed portion-forming layers in Example 1.

FIG. 3c shows a view illustrating non-printed portion-forming layers in Example 1.

DETAILED DESCRIPTION

Figure 1:
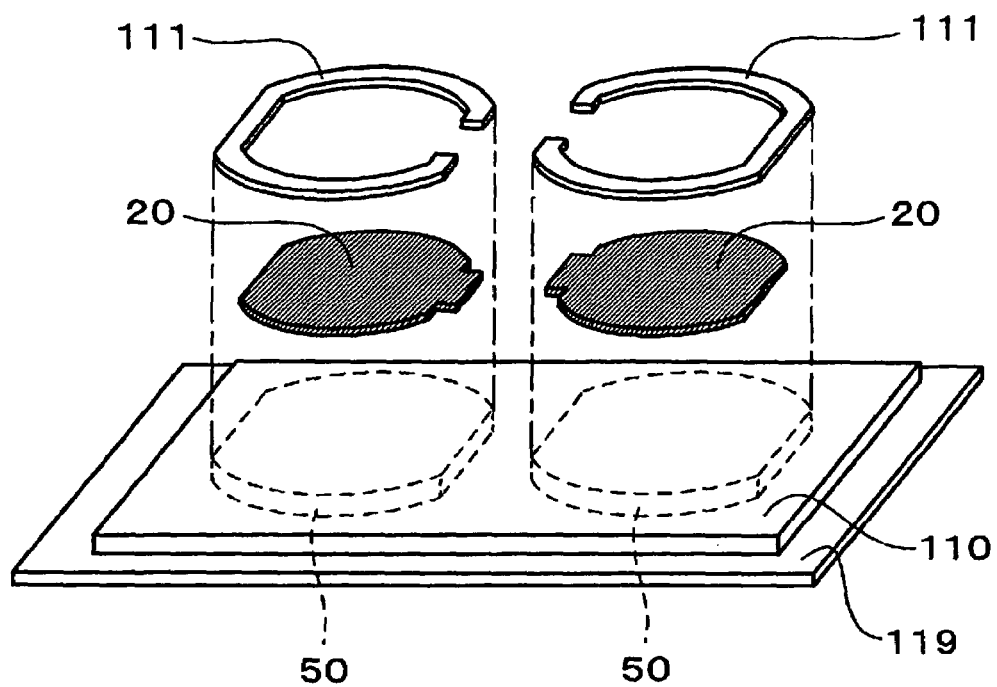
FIG. 1 shows a view illustrating the steps of printing inner electrode layers and spacer layers in Example 1.

In the above first invention, it is desired that the intermediate laminated body-forming step includes:

a sheet-forming step of forming the green sheet;

an adhesive layer-printing step of printing an adhesive layer of the same material as the green sheet on the surface of the uppermost green sheet, and of forming printed portions on which the adhesive layer is printed, and non-printed portions on which the adhesive layer is not printed, in the relaxing layer-forming portions where the relaxing layers are formed in the portion that becomes the non-overlapped portion; and a laminating step of laminating the green sheets and forming the voids comprising the non-printed portions between the green sheets.

In this case, the voids can be easily and reliably formed in the green sheets. Thus, the relaxing layers including the voids can be easily and reliably formed in the ceramic laminated body after calcining.

It is further desired that, after the sheet-forming step, an electrode-printing step is executed to print the inner electrode layer on the green sheet and to print a spacer layer of a thickness nearly equal to that of the inner electrode layer neighboring the region where the inner electrode layer is printed and, in the adhesive layer-printing step, the adhesive layer is printed on the inner electrode layer and on the spacer layer.

In this case, the voids can be formed along the inner electrode layers. The relaxing layers including the voids can be formed in the ceramic laminated body after calcining along the inner electrode layers. When driven, therefore, the relaxing layers undergo a deformation to disperse and relax the stress caused by the piezoelectric displacement.

It is further desired that, in the adhesive layer-printing step, the area of a portion for providing the non-printed portions is 20 to 65% of the area of the relaxing layer-forming portion on the same plane.

In this case, the voids can be formed to a sufficient degree. Therefore, the relaxing layers exhibit the effect of relaxing the stress to a sufficient degree.

When the area of the portion where the non-printed portions are provided is smaller than 20% of the area of the relaxing layer-forming portion on the same plane, the relaxing layers may not often exhibit the effect of relaxing the stress to a sufficient degree. When the above area exceeds 60%, on the other hand, the strength of the portions forming the relaxing layers may decrease. When driven, therefore, cracks may occur in the relaxing layers.

It is further desired that, in the adhesive layer-printing step, a plurality of mini-blocks comprising the adhesive layer are printed while maintaining a gap, as the printed portions on the relaxing layer-forming portions, and the non-printed portions are provided among the mini-blocks.

In this case, the relaxing layers including voids can be easily and reliably formed. Therefore, the relaxing layers exhibit the effect of relaxing the stress sufficiently and reliably.

The mini-blocks may assume various shapes in cross section, such as a circular shape, a triangular shape, a square shape or the like shape. There may be printed mini-blocks which are all of the same shape and of the same size. Or, there may be printed mini-blocks which are of a plurality of different shapes and different sizes.

It is further desired that, in the adhesive layer-printing step, the mini-blocks may be printed while being regularly arranged or being arranged at random.

In this case, the gaps formed among the mini-blocks are regularly arranged. Therefore, the relaxing layers including the regularly arranged voids can be formed in the ceramic laminated body after calcining. Accordingly, the relaxing layers exhibit a further improved effect for relaxing the stress.

In the above second invention, it is desired that the intermediate laminated body-forming step includes:

a sheet-forming step of forming the green sheet;

an adhesive layer-printing step of printing an adhesive layer of the same material as the green sheet on the surface of the uppermost green sheet, and of printing the material for forming relaxing layers maintaining a thickness nearly the same as the adhesive layer on relaxing layer-forming portions where the relaxing layers are to be formed on the portion that becomes the non-overlapped portion; and a laminating step of laminating the green sheets.

In this case, the voids can be easily and reliably formed in a portion neighboring the material for forming relaxing layers in the ceramic laminated body after being calcined.

It is further desired that, after the sheet-forming step, an electrode-printing step is executed to print the inner electrode layer on the green sheet and to print a spacer layer of a thickness nearly equal to that of the inner electrode layer neighboring the region on where the inner electrode layer is printed and, in the adhesive layer-printing step, the adhesive layer and the material for forming relaxing layers are printed on the inner electrode layer and on the spacer layer.

In this case, the material for forming relaxing layers can be arranged along the inner electrode layers. The relaxing layers including voids can be formed in the ceramic laminated body after being calcined along the inner electrode layers. When driven, therefore, the relaxing layers undergo a deformation to disperse and relax the stress caused by the piezoelectric displacement.

It is further desired that the adhesive layer and the material for forming relaxing layers contain the same ceramic starting powder as a chief component, and an average particle size A of the ceramic starting powder contained in the adhesive layer and an average particle size B of ceramic starting powder contained in the material for forming relaxing layers, satisfy a relationship $A > 1.05 \times B$.

In this case, the voids and the relaxing layers including voids can be reliably formed in the portions neighboring the material for forming the relaxing layers.

It is further desired that the ceramic starting powder contained in the adhesive layer has an average particle size A of 0.3 to 0.8 μm. It is further desired that the ceramic starting powder contained in the material for forming relaxing layers has an average particle size B of 0.1 to 0.6 μm.

In this case, the voids can be formed in the ceramic laminated body after calcining sufficiently and reliably.

In the above first invention and second invention, it is desired that the laminate-type piezoelectric element is a piezoelectric actuator for an injector used as a drive source of the injector.

The injector is used under a severe condition of a high-temperature atmosphere. By using the above excellent laminate-type piezoelectric element as an actuator, therefore, the reliability and durability can be improved, and the performance of the injector as a whole can be enhanced.

EXAMPLES

Example 1

A method of producing a laminate-type piezoelectric element according to an embodiment of the first invention will be described with reference to the drawings.

The method of producing a laminate-type piezoelectric element 1 is a method of producing the laminate-type piezoelectric element 1 which, as shown in FIGS. 1 to 13, has a ceramic laminated body 10 obtained by alternately laminating piezoelectric layers 11 made of a piezoelectric material and inner electrode layers 20 having electrically conducting property, and having outer electrodes 34 arranged on the side surfaces 101 and 102 of the ceramic laminated body 10.

The ceramic laminated body 10 is formed through an intermediate laminated body-forming step of forming an intermediate laminated body 100 by alternately laminating green sheets 110 that serve as the piezoelectric layers 11 and the inner electrode layers 20, and a calcining step of forming the ceramic laminated body 10 by calcining the intermediate laminated body 100.

In the intermediate laminated body-forming step, there are formed an overlapped portion 108 which is a region where the inner electrode layers 20 are all overlapped one upon the other, and a non-overlapped portion 109 which is a region where only some of the inner electrode layers 20 are overlapped or none of them are overlapped at all when the intermediate laminated body 100 is viewed in the direction of lamination, and voids 40 are formed in advance in at least part of the non-overlapped portion 109. In the calcining step, relaxing layers 4 including voids 40 are formed.

This will now be described in detail.

<Intermediate Laminated Body-forming Step>

In the intermediate laminated body-forming step, four steps are executed, i.e., a sheet-forming step, an electrode-printing step, an adhesive layer-printing step and a laminating step.

First, the sheet-forming step is executed.

A ceramic starting powder which is a piezoelectric material is provided and pre-calcined at 800 to 950° C. Pure water and a dispersant are added to the pre-calcined powder to obtain a slurry thereof which is, then, wet-milled by using a pearl mill. The milled material is dried and degreased, and a solvent, a binder, a plasticizer and a disersant are added to obtain a slurry thereof, which is, then, mixed by using a ball mill. The slurry is defoamed in a vacuum and is adjusted for viscosity while being stirred using a stirrer in a vacuum device.

Referring to FIG. 1, the slurry is applied onto a carrier film 119 by a doctor blade method, and a green sheet 110 of a predetermined thickness is formed in an elongated shape. FIG. 1 shows only a portion of the elongated green sheet 110.

In this Example, lead zirconate titanate (PZT) is used as a ceramic starting material which is a piezoelectric material. The green sheet 110 can be further formed by an extrusion-molding method or by various other methods in addition to the doctor blade method used in this Example.

Next, the electrode-printing step is executed.

Referring to FIG. 1, inner electrode layers 20 are screen-printed on the punching regions 50 of the green sheet 110 that is formed. Spacer layers 111, having a thickness the same as that of the inner electrode layers 20, are screen-printed onto the portions where the inner electrode layers 20 have not been printed so that the height becomes nearly the same between the portions where the inner electrode layers 20 are printed and other portions.

The punching regions 50 referred to here are the regions where the green sheet 110 will be punched at a subsequent step. Further, the punching regions 50 in this Example are of the shape of a barrel but can be changed into various shapes such as a circular shape, a square shape, an octagonal shape or the like shape depending upon the shape of the ceramic laminated body 10 that is to be fabricated.

In this Example, further, in order to efficiently punch and laminate the green sheets 110 by using a punching/laminating device that will be described later, the inner electrode layers 20 exposed on the side surfaces are so printed that the directions thereof are alternately reversed in the lengthwise direction of the elongated green sheet 110 (see FIG. 1).

An Ag/Pd alloy is used as the inner electrode layers 20. There can be further used single metals such as Ag, Pd, Cu, Ni and alloys such as Cu/Ni, etc. The material which is the same as the green sheet 110 is used as the spacer layer 111.

Next, the adhesive layer-printing step is executed.

Figure 2:
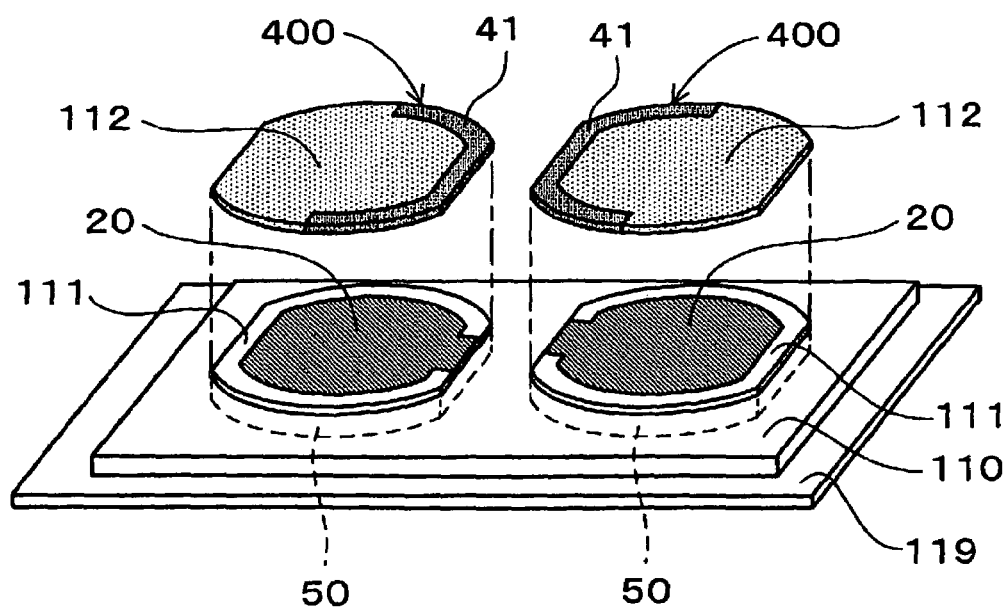
FIG. 2 shows a view illustrating the steps of printing adhesive layers in Example 1.

Referring to FIG. 2, an adhesive layer 112 is screen-printed on the inner electrode layers 20 and on the spacer layers 111 that are printed in order to enhance the effect of adhesion at the time of laminating the green sheet 110. Here, a non-printed portion-forming layer 41 is formed for forming printed portions where the adhesive layer 112 is printed and non-printed portions where it is not printed on a relaxing layer-forming portion 400 where the relaxing layer 4 is formed in the portion that becomes the non-overlapped portion 109 of the intermediate laminated body 100. The relaxing layer-forming portion 400 in this Example is a portion that becomes the non-overlapped portion 109, i.e., a half of the outer circumferential portion of the punching region 50 where the inner electrode layer 20 is exposed on the side surface thereof.

As the adhesive layer 112, a material the same as that of the green sheet 110 is used.

The non-printed portion-forming layer 41 will be described below. As shown in FIG. 3a, the non-printed portion-forming layer 41 is formed by printing, while maintaining a gap relative to each other, a plurality of mini-blocks 411 of the adhesive layer as a printed portion for forming the adhesive layer 112. In this Example, circular mini-blocks 411 which are all of the same size are printed like dots (like islands) and are regularly arranged. Non-printed portions with no adhesive layer 112 are formed among the mini-blocks 411. The area of the non-printed portions 412 is 45% of the area of the relaxing layer-forming portion 400 (non-printed portion-forming layer 41) on the same plane.

In this Example, the mini-blocks 411 are of a circular shape but may be of various shapes such as a square shape (FIG. 3b), a triangular shape (FIG. 3c) or the like shape. Though the mini-blocks 411, which are all of the same shape and of the same size, are printed the mini-blocks 411 of a plurality of different shapes and different sizes may be printed.

In the Example, further, the mini-blocks 411 are printed in the shape of dots (islands) but may be printed in various other shapes. Further, the mini-blocks are printed being regularly arranged but may further be printed being arranged in a random fashion.

Next, the laminating step is executed.

The punching and lamination of the green sheet 110 are executed in parallel by using a punching/laminating device (not shown) that is so constituted as to punch and laminate the green sheet 110 simultaneously. As the punching/laminating device, there can be used the one having punching means with a Thomson blade for punching the green sheet 110 and laminated body-holding means for forming a laminated body by laminating the punched green sheets 110 and for holding the laminated body.

Figure 4:
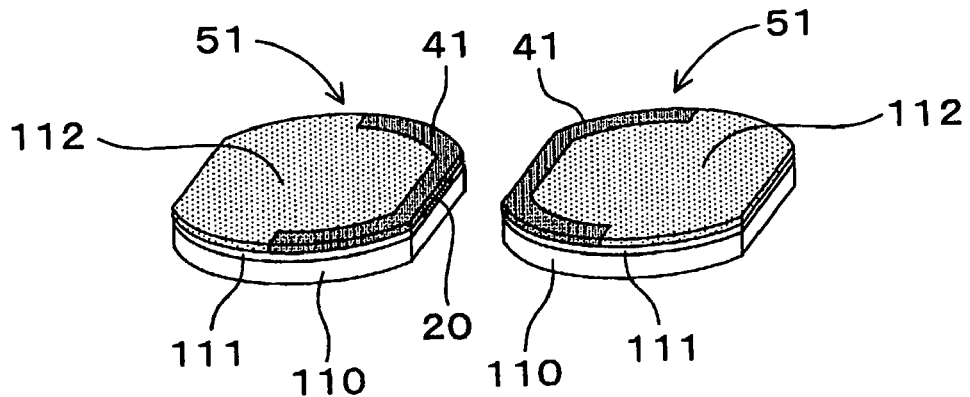
FIG. 4 shows is a view illustrating sheet pieces in Example 1.

First, the printed green sheet 110 is set together with the carrier film 119 onto the above punching/laminating device, and the punching region 50 of the green sheet 110 is punched to obtain sheet pieces 51 as shown in FIG. 4.

Figure 5:
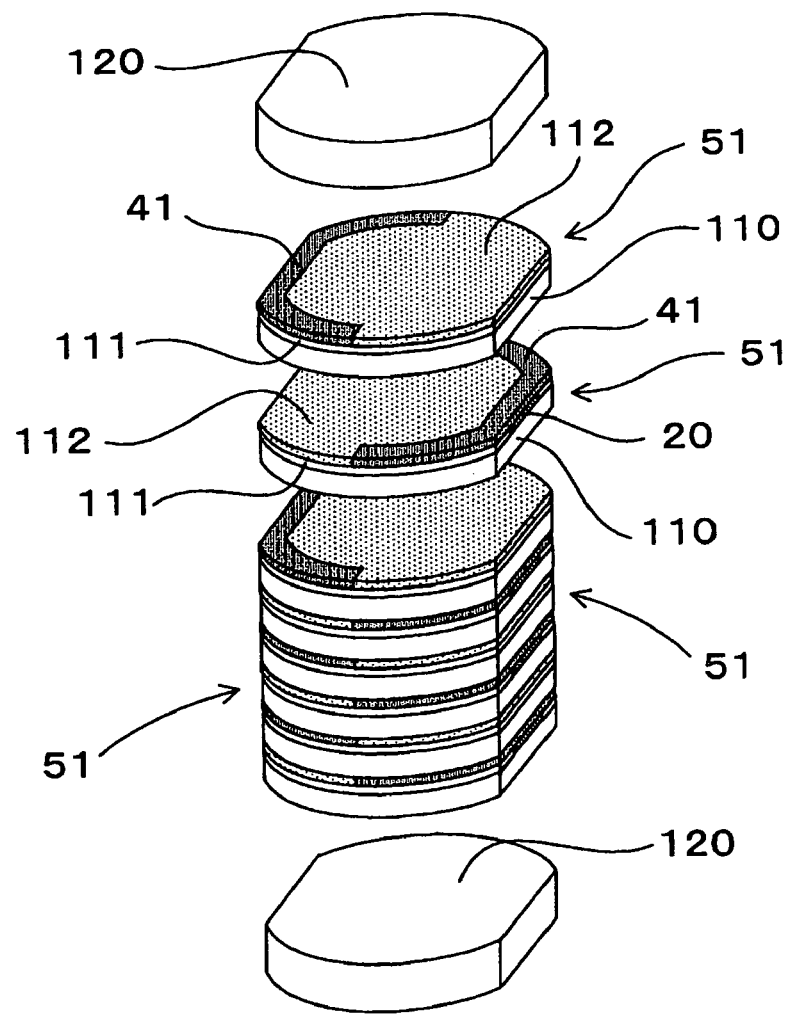
FIG. 5 shows a view illustrating a step of laminating the sheet pieces in Example 1.

Referring, next, to FIG. 5, the obtained sheet pieces 51 are so laminated that the inner electrode layers 20 exposed on the side surfaces are alternately directed. Protection layer-forming sheets 120 for forming final protection layers 12 are laminated on the upper and lower ends. The protection layer-forming sheets 120 are made of the same material as the green sheet 110.

Figure 6:
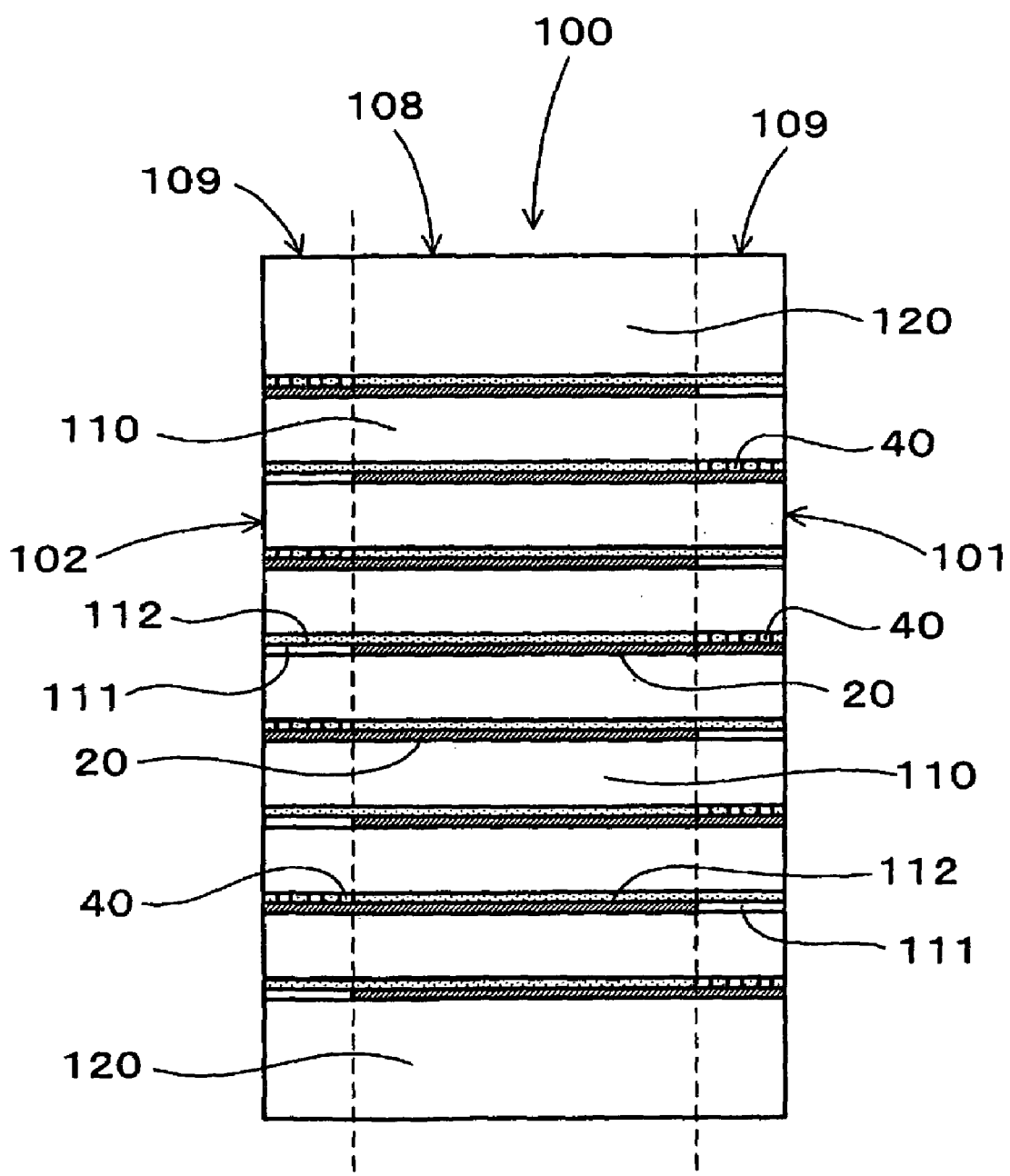
FIG. 6 shows a sectional view illustrating an intermediate laminated body in Example 1.

Thus, an intermediate laminated body 100 is obtained as shown in FIG. 6. In the intermediate laminated body 100, there are formed an overlapped portion 108 which is a region where the inner electrode layers 20 are all overlapped one upon the other, and a non-overlapped portion 109 which is a region where only some of the inner electrode layers 20 are overlapped or none of them are overlapped at all when the intermediate laminated body 100 is viewed in the direction of lamination. The intermediate laminated body 100, further, has a pair of side surfaces 101 and 102, and the inner electrode layers 20 are alternately exposed on the side surfaces 101 and 102.

Figure 7:
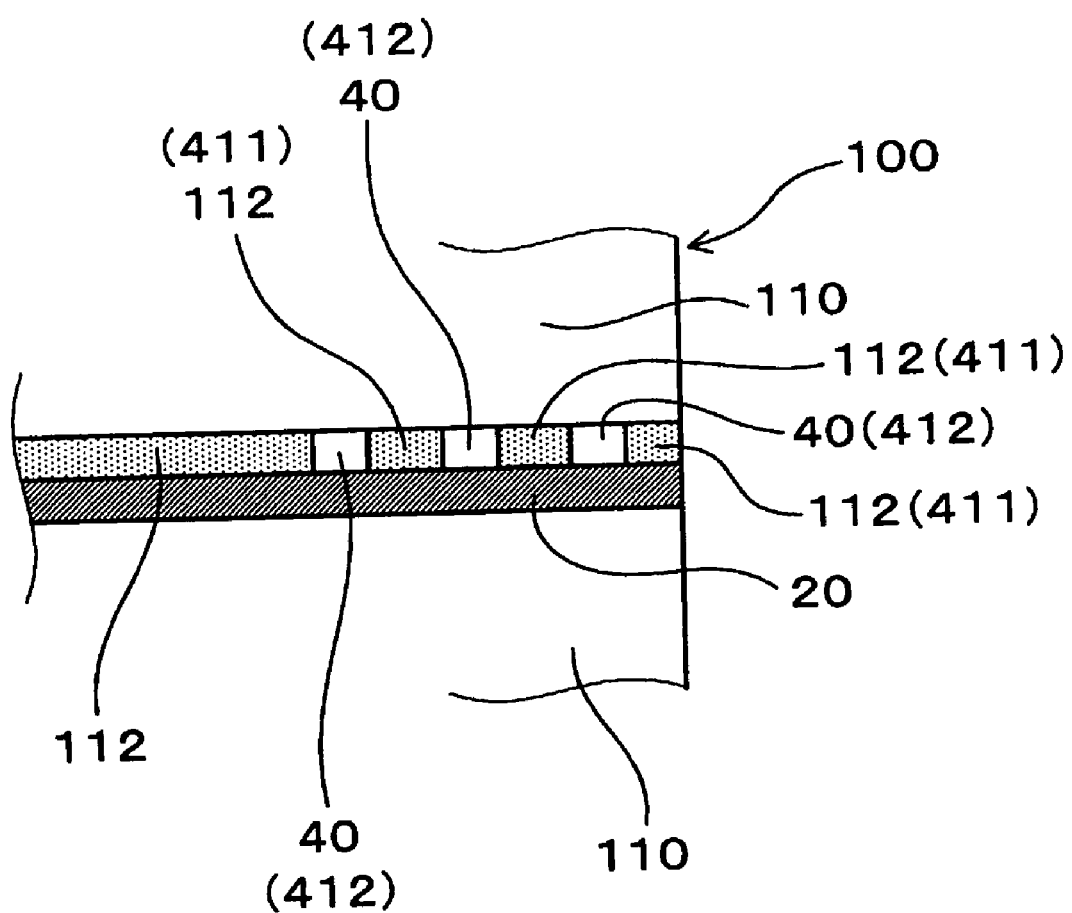
FIG. 7 shows a sectional view illustrating, on an enlarged scale, a major portion of the intermediate laminated body in Example 1.

As shown in FIGS. 6 and 7, further, non-printed portions 412 where no adhesive layer 112 is printed are provided between the green sheets 110 in the non-overlapped portion 109 of the intermediate laminated body 100 to thereby form voids 40 at that portions. In other words, voids 40 are formed among the mini-blocks 411 comprising the adhesive layer 112 as the printing portion.

Next, a side electrode material (not shown) for forming side electrodes is applied onto the side surfaces 101 and 102 of the intermediate laminated body 100. This is a step of forming side electrodes 30 (see FIG. 13) on the side surfaces 101 and 102 of the ceramic laminated body 10 by the subsequent calcining for improving electric conductivity to the inner electrode layers 20. The side electrodes 30 may not be provided. In this case, the above step may be omitted.

<Calcining Step>

Next, the calcining step is executed.

Prior to executing the calcining step, first, the intermediate laminated body 100 is degreased. The heating condition consists of elevating the temperature up to 500° C. over 80 hours and holding this temperature for 5 hours. Thus, the organic components contained in the intermediate laminated body 100 are removed. The intermediate laminated body 100 after being degreased is calcined at a maximum temperature of 1065° C. for 2 hours.

Figure 8:
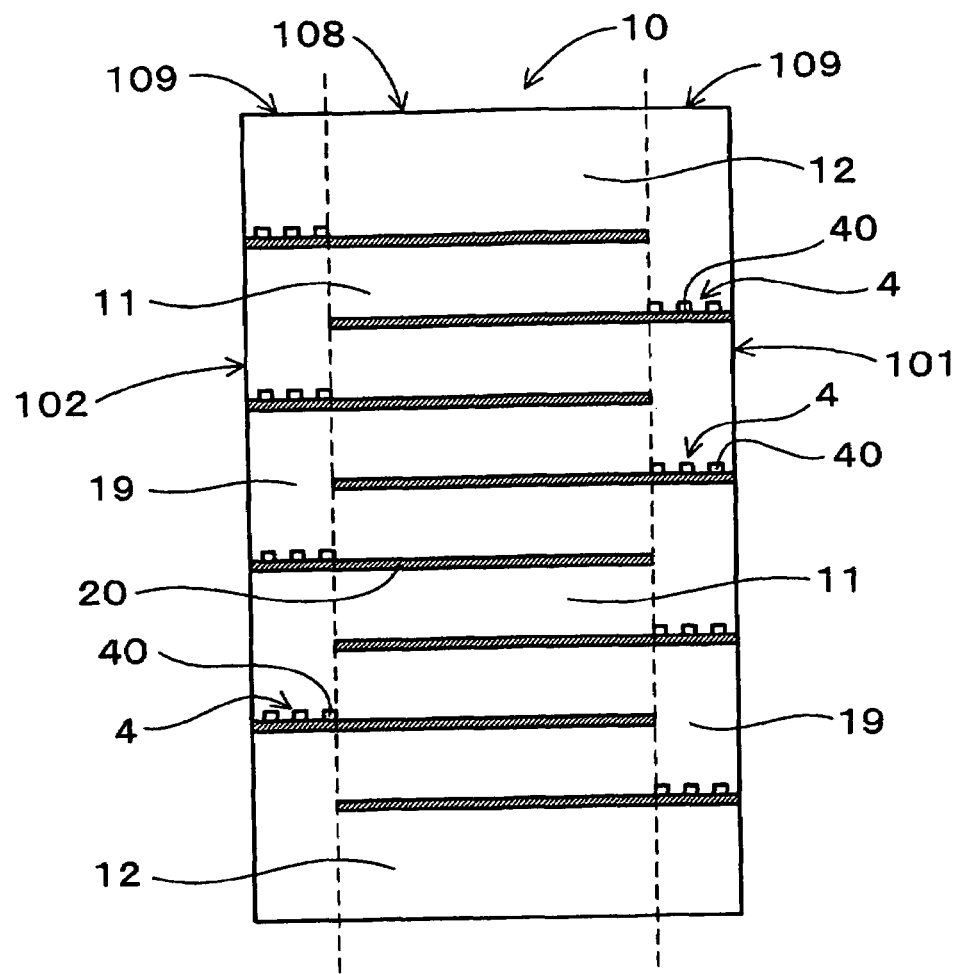
FIG. 8 shows a sectional view illustrating the internal structure of a ceramic laminated body in Example 1.
Figure 9:
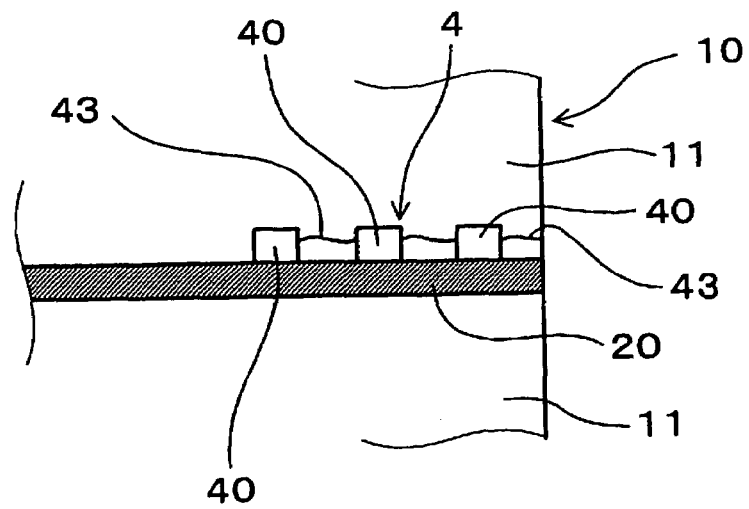
FIG. 9 shows a sectional view illustrating, on an enlarged scale, a major portion of the ceramic laminated body in Example 1.
Figure 10:
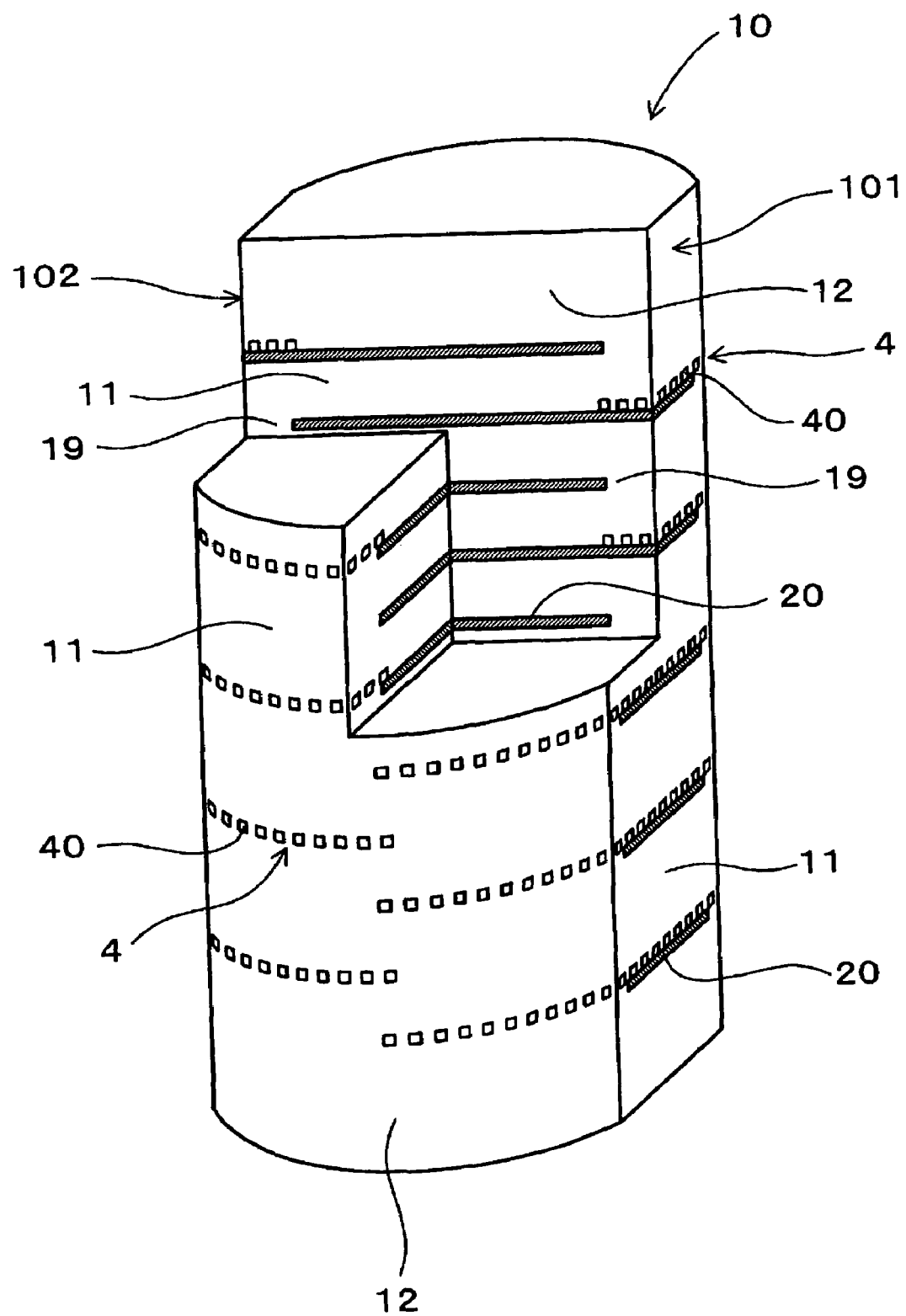
FIG. 10 shows a view illustrating the whole structure of the ceramic laminated body in Example 1.

Thus, the ceramic laminated body 10 is obtained as shown in FIGS. 8 to 10. The ceramic laminated body 10 is obtained by alternately laminating piezoelectric layers 11 of a piezoelectric material and inner electrode layers 20 having electrically conducting property, and has an overlapped portion 108 and a non-overlapped portion 109. The adhesive layer 112 is formed as a portion of the piezoelectric layer 11, and the spacer layer 111 is an electrode non-forming portion 19 where the end of the inner electrode layer 20 is not formed inward. The protection layers 12 are formed on the upper and lower ends of the ceramic laminated body 10, and side electrodes 30 (not shown) are formed on the side surfaces 101 and 102.

As shown in the same drawings, further, the voids 40 formed in the intermediate laminated body 100 are existing in the non-overlapped portion 109 of the ceramic laminated body 10 even after the calcining. The relaxing layers 4 including voids 40 are formed along the inner electrode layers 20.

As shown in FIG. 9, further, openings 43 due to tiny cracks are formed among the voids 40 in the circumferential direction. The tiny cracks forming the openings 43 are produced as the mini-blocks 411 (see FIG. 7) comprising the adhesive layer 112 undergo the contraction through calcining slightly earlier than the neighboring green sheets 110.

Next, after the calcining step, a step is executed for arranging a pair of outer electrodes 34 on the side surfaces 101 and 102 of the ceramic laminated body 10.

Figure 11:
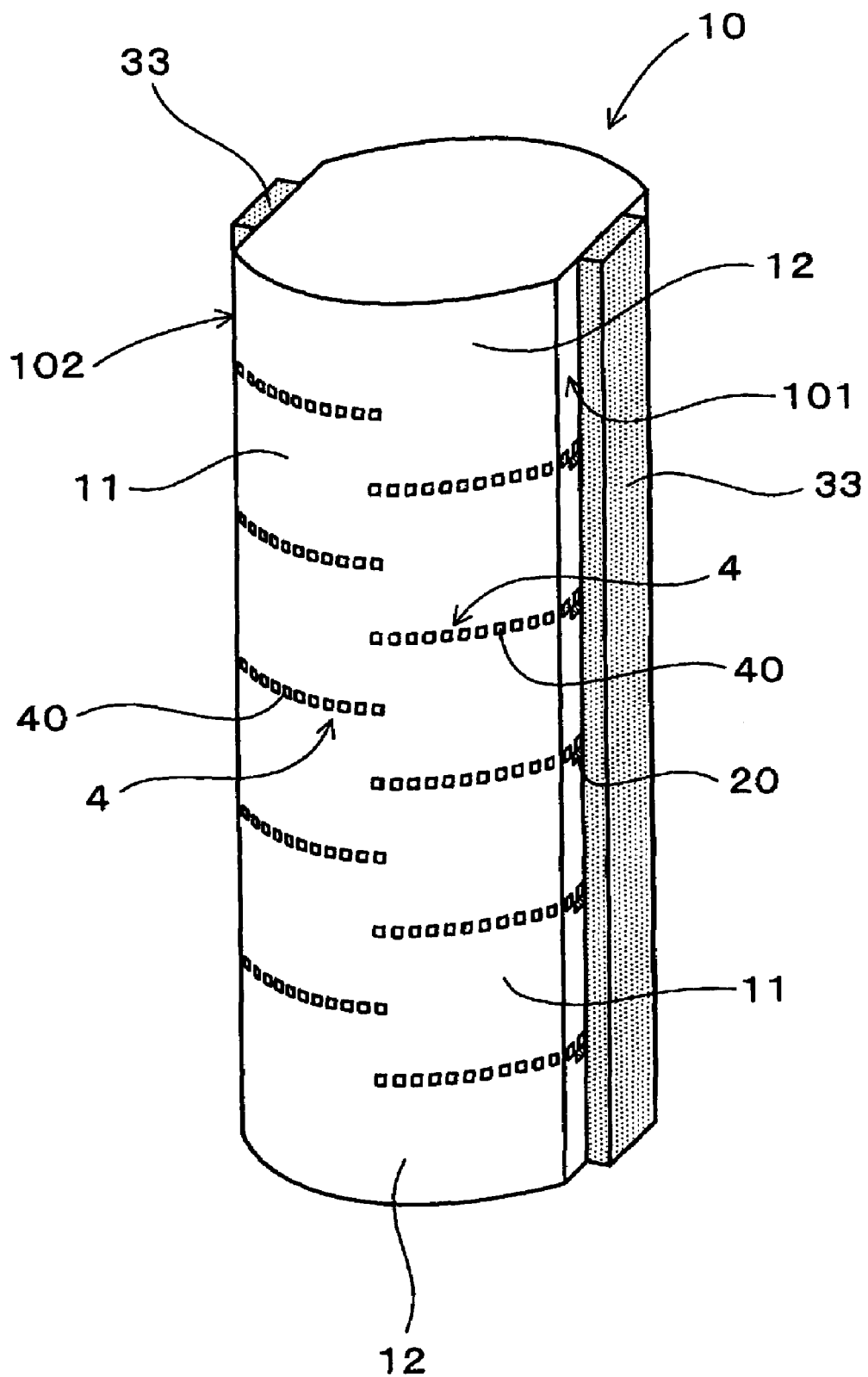
FIG. 11 shows a view illustrating a step of applying an electrically conducting adhesive in Example 1.
Figure 12:
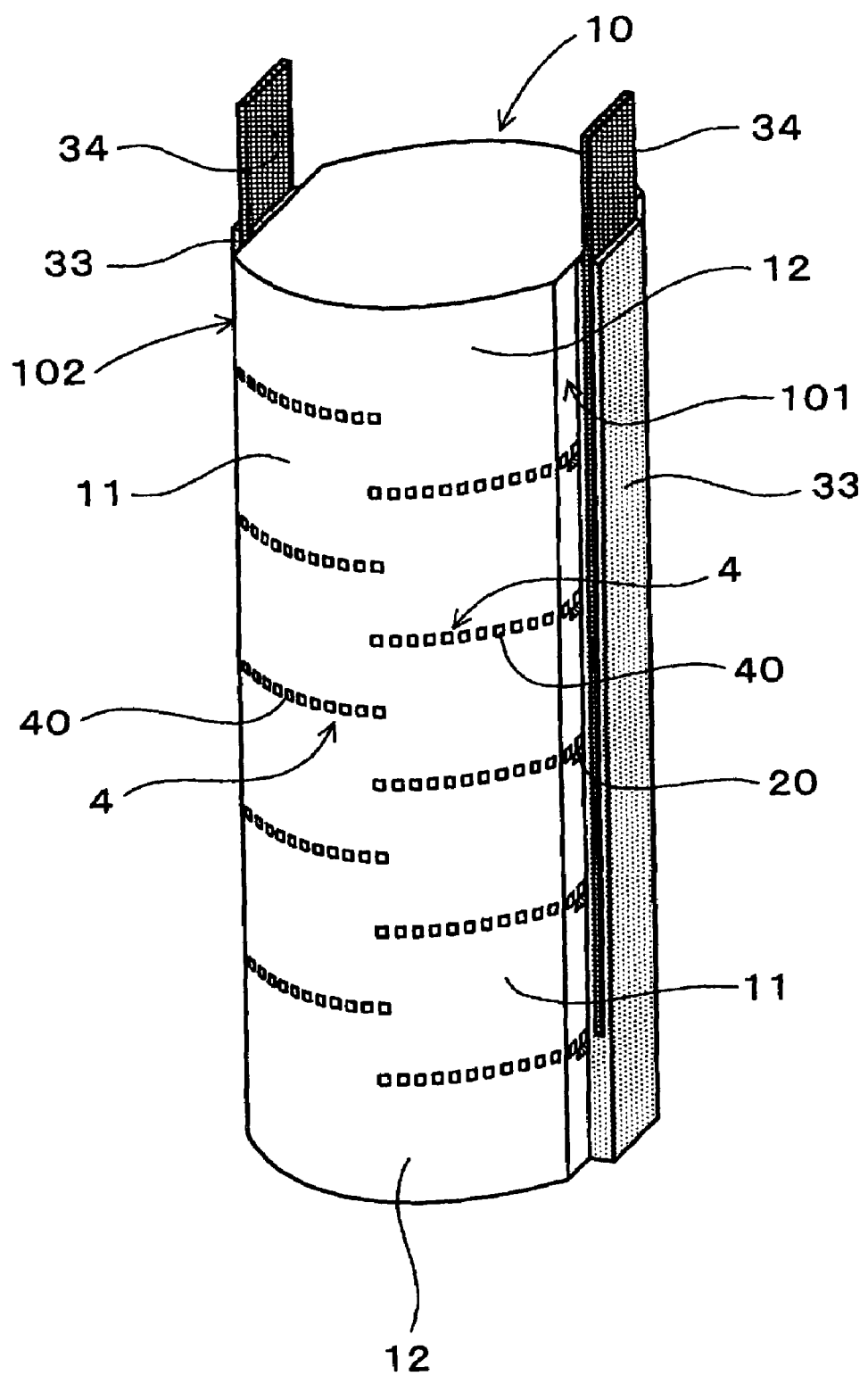
FIG. 12 shows a view illustrating a step of arranging outer electrodes in Example 1.

Referring to FIG. 11, an electrically conducting adhesive 33 is applied onto the side electrodes 30 formed on the side surfaces 101 and 102 of the ceramic laminated body 10. Referring to FIG. 12, outer electrodes 34 are arranged on the electrically conducting adhesive 33. The electrically conducting adhesive 33 is heated and cured so as to be adhered to the outer electrodes 34. Finally, though not shown, the whole side surfaces of the ceramic laminated body 10 are molded with a molding material 35 of an insulating resin (see FIG. 13).

In this Example, an epoxy resin which is an insulating resin in which Ag is dispersed as an electrically conducting filler is used as the electrically conducting adhesive 33. As the insulating resin, there can be used various resins such as silicone, urethane, polyimide and the like in addition to the above resin. As the electrically conducting filler, further, there can be used platinum, Cu, Ni or the like in addition to the above-mentioned element.

As the outer electrodes 34, mesh-like expanded metal obtained by working a metal plate is used. There can be further used a punched metal.

Further, a silicone resin is used as a molding material 35. There can be further used a polyimide resin, an epoxy resin or the like.

Figure 13:
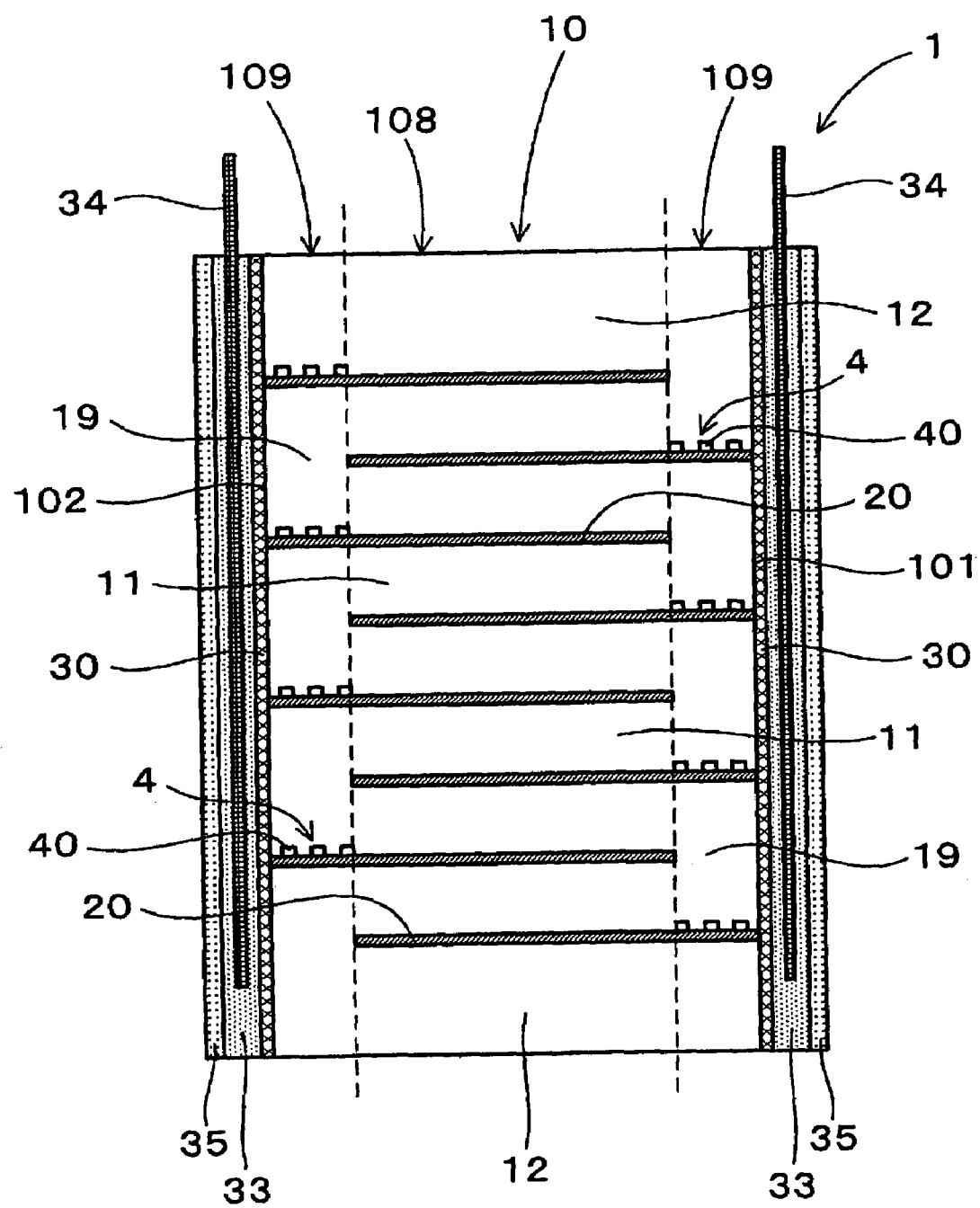
FIG. 13 shows a view illustrating the structure of a laminate-type piezoelectric element in Example 1.

The laminate-type piezoelectric element 1 of FIG. 13 is thus obtained.

In the thus obtained laminate-type piezoelectric element 1, the ceramic laminated body 10 is fabricated by alternately laminating the piezoelectric layers 11 and the inner electrode layers 20 as described above and as shown in FIGS. 10 and 13. Further, the ceramic laminated body 10 has a so-called electrode non-forming structure in which the ends of the inner electrode layers 20 are not exposed on the side surfaces 101, 102 but are not formed partly inward due to electrode non-forming portions 19.

When viewed in the direction of lamination, further, the ceramic laminated body 10 includes an overlapped portion 108 which is a region where the inner electrode layers 20 are all overlapped one upon the other and a non-overlapped portion 109 which is a region where only some of the inner electrode layers 20 are overlapped or none of them are overlapped at all. In the non-overlapped portion 109, the relaxing layers 4 including voids 40 are formed along the inner electrode layers 20. The relaxing layers 4 are formed over one-half the outer circumferential portion of the ceramic laminated body 10. The relaxing layers 4 are further alternately formed on the side of the side surface 101 and on the side of the side surface 102 in the direction of lamination.

Referring to FIG. 13, further, the ends of the inner electrode layers 20 are alternately exposed on the side surfaces 101 and 102 of the ceramic laminated body 10 and are electrically conductive to a pair of side electrodes 30 that are suitably arranged. Further, external electrodes 34 are joined to the pair of side electrodes 30 via the electrically conducting adhesive 33. The whole side surfaces of the ceramic laminated body 10 are molded with a molding material 35 so as to cover the side electrodes 30, electrically conducting adhesives 33 and external electrodes 34.

The ceramic laminated body 10 of this Example has the shape of a barrel in cross section. The sectional shape of the ceramic laminated body 10 is not limited to the barrel shape only as in this Example, but may be a circular shape, a square shape or an octagonal shape depending upon the use.

Next, described below are the action and effect in the method of producing the laminate-type piezoelectric element 1 of this Example.

In the method of producing the laminate-type piezoelectric element 1 according to this Example, voids 40 are formed in advance in the non-overlapped portion 109 of the intermediate laminated body-forming step. The voids 40 formed in the intermediate laminated body 100 before being calcined continue to remain even after the calcining through the calcining step. Thus, the relaxing layers 4 including voids 40 can be easily formed in the non-overlapped portion 109 of the ceramic laminated body 10 obtained after the calcining. Upon including voids 40, the relaxing layers 4 are capable of dispersing and relaxing stress caused by the piezoelectric displacement. That is, relying upon the production method of this Example, the structure for relaxing the stress can be easily formed.

According to the production method of this Example, the relaxing layers 4 are formed in the non-overlapped portion 109 which is a portion that does not undergo piezoelectric displacement and cannot be driven. That is, the relaxing layers 4 are formed in the non-overlapped portion 109 where stress concentrates due to piezoelectric displacement. Therefore, the stress can be effectively dispersed and relaxed by the relaxing layers 4 that include voids 40. This prevents stress from concentrating in the non-overlapped portion 109 despite of piezoelectric displacement and suppresses the occurrence of cracks.

Owing to its excellent effect described above, the laminate-type piezoelectric element 1 produced by the above production method of this Example maintains its high quality and performance even after used for extended periods of time. This accounts for its excellent durability and reliability.

In this Example, further, the intermediate laminated body-forming step includes a sheet-forming step of forming the green sheet 110, an adhesive layer-printing step of forming printed portions (mini-blocks 411) where the adhesive layer 112 is printed and non-printed portions 412 on where it is not printed in the relaxing layer-forming portions 40 where the relaxing layers 4 are formed in the portion that becomes the non-overlapped portion 109, and a laminating step of forming the voids 40 comprising the non-printed portions 412 among the green sheets 110. Therefore, the voids 40 can be easily and reliably formed among the green sheets 110. Thus, the relaxing layers 4 including voids 40 are easily and reliably formed in the ceramic laminated body 10 after calcining.

In the adhesive layer-printing step, the area of the portion where the non-printed portions 412 are formed is 45% of the area of the relaxing layer-forming portion 400 on the same plane. Therefore, voids 40 can be formed to a sufficient degree. Accordingly, the relaxing layers 4 exhibit the effect of relaxing the stress to a sufficient degree.

In the adhesive layer-printing step, further, a plurality of mini-blocks 411 comprising the adhesive layer 112 are printed maintaining a gap as the printed portions on the relaxing layer-forming portions 400, and the non-printed portions 412 are provided among the mini-blocks 411. Further, the mini-blocks 411 are printed being regularly arranged. Therefore, the relaxing layers 4 including regularly arranged voids 40 can be formed in the ceramic laminated body 10 after calcining. Accordingly, the relaxing layers 4 exhibit the effect of relaxing the stress more efficiently.

In the relaxing layers 4, openings 43 due to tiny cracks are formed in the circumferential direction among the voids 40. Due to the tiny cracks formed in the circumferential direction, the openings 43, too, work to relax the stress caused by the piezoelectric displacement. Therefore, the relaxing layers 4 exhibit further improved effect for relaxing the stress.

According to the production method of the present invention as described above, the structure can be easily formed for relaxing the stress caused by the piezoelectric displacement. The laminate-type piezoelectric element produced by the above production method exhibits excellent durability and reliability.

Figure 14:
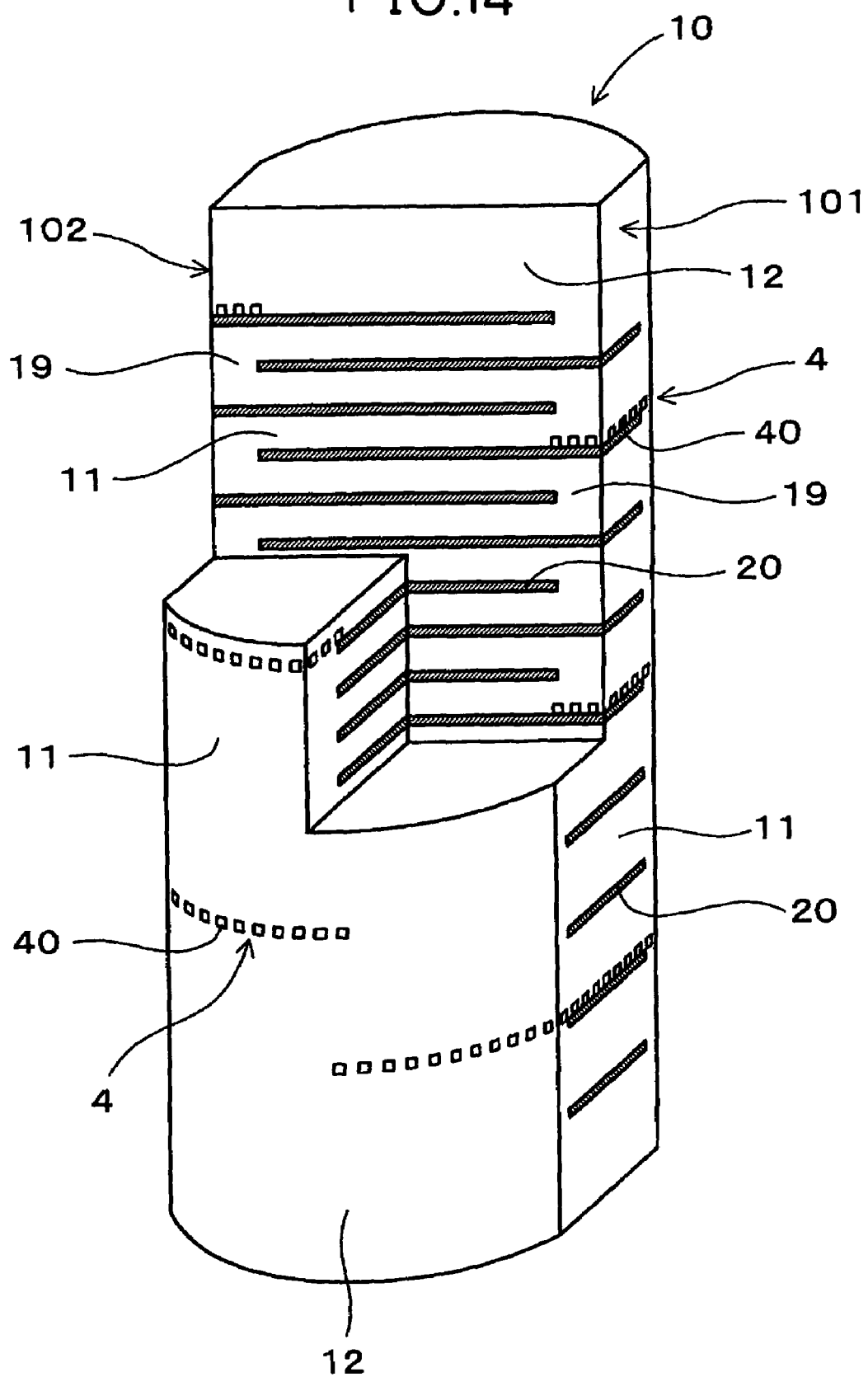
FIG. 14 shows a view illustrating an example of varying the positions of relaxing layers in the ceramic laminated body in Example 1.

In the ceramic laminated body 10, the positions and shapes of the relaxing layers 4 can be varied depending upon the positions and shape of voids 40 that are formed in advance at the time of fabricating the intermediate laminated body 100. In this Example, the relaxing layer 4 is formed along every inner electrode layer 20. As shown in FIG. 14, however, the relaxing layer 4 may be formed along every fourth inner electrode layer 20 or may be formed at various other positions. In this Example, further, the relaxing layers 4 are formed over a half of the outer circumference of the ceramic laminated body 10. The relaxing layers 4, however, may be formed along the whole circumference or may be formed on the side surfaces 101 and 102 only.

Example 2

A method of producing the laminate-type piezoelectric element according to an embodiment of the second invention will be described with reference to the drawings.

The method of producing the laminate-type piezoelectric element 1 includes, as shown in FIGS. 15 to 22, the intermediate laminated body-forming step and the calcining step as in Example 1.

In the intermediate laminated body-forming step, there are formed an overlapped portion 108 and a non-overlapped portion 109 in the intermediate laminated body 100, and a material 42 is arranged on at least a portion in the non-overlapped portion 109 for forming relaxing layers having a calcining temperature lower than that of the green sheet 110 and contracting greatly in the calcining step. In the calcining step, further, relaxing layers 4 including voids 40 are formed by having the material 42 for forming relaxing layers contract more than the neighboring portions.

This will now be described in detail.

<Intermediate Laminated Body-forming Step>

In the intermediate laminated body-forming step, four steps are executed, i.e., the sheet-forming step, the electrode-printing step, the adhesive layer-printing step and the laminating step as in Example 1.

In the sheet-forming step and in the electrode-printing step as shown in FIG. 1, first, the green sheet 110 is formed on the carrier film 119 as in Example 1. The inner electrode layers 20 and the spacer layers 111 are screen-printed on the punching regions 50 of the green sheet 110.

Figure 15:
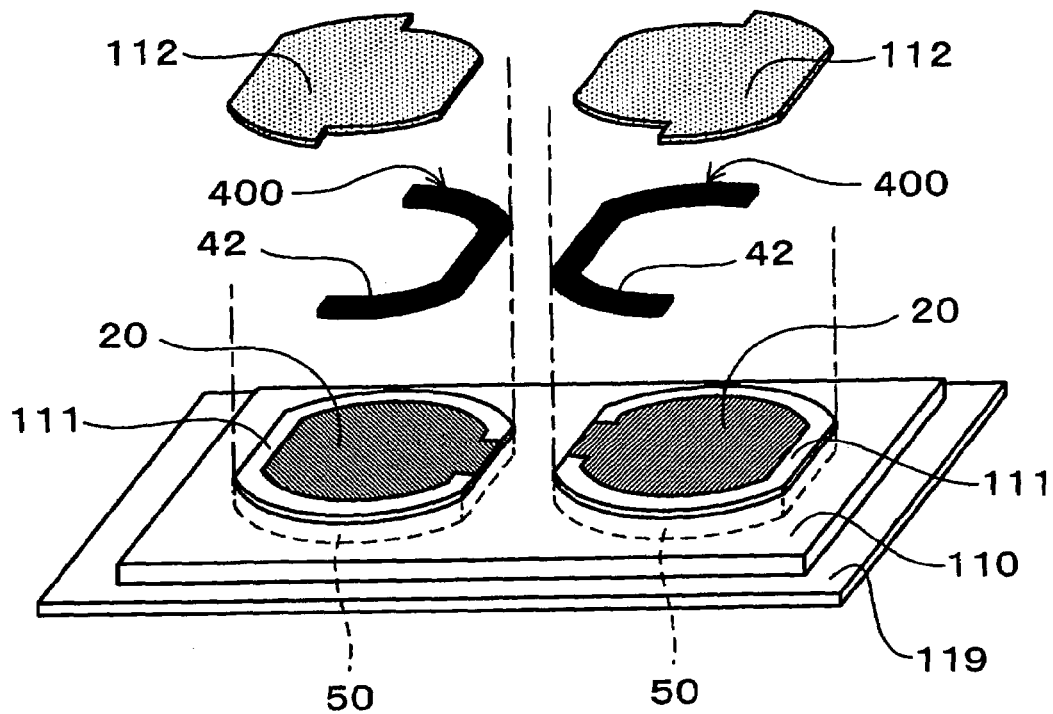
FIG. 15 shows a view illustrating a step of printing a material for forming relaxing layers and an adhesive layer in Example 2.

Next, in the adhesive layer-printing step as shown in FIG. 15, the material 42 for forming relaxing layers is screen-printed on the relaxing layer-forming portions 400 on where the relaxing layers 4 are to be formed, and an adhesive layer 112 of the same material as the green sheet 110 is screen-printed on the inner electrode layers 20 and on the spacer layers 111 that are printed in the non-overlapped portion 109.

Both the adhesive layer 112 (green sheet 110) and the material 42 for forming relaxing layers contain the same ceramic starting powder as a main component, i.e., contain lead zirconate titanate (PZT). An average particle size A of the ceramic starting powder contained in the adhesive layer 112 and an average particle size B of the ceramic starting powder contained in the material 42 for forming relaxing layers, satisfy a relationship A>1.05×B. In this Example, the average particle size A is 0.5 μm and the average particle size B is 0.3 μm.

Here, when the same ceramic starting powder is contained, as a chief component, as the adhesive layer 112 and the material 42 for forming relaxing layers, the calcining temperature decreases and the temperature at which contraction starts by calcining decreases with a decrease in the average particle size. That is, the material 42 for forming relaxing layers has a calcining temperature lower than that of the adhesive layer 112 (green sheet 110). Besides, the contraction becomes greater than that of the adhesive layer 112 when the calcining temperature is the same.

Figure 16:
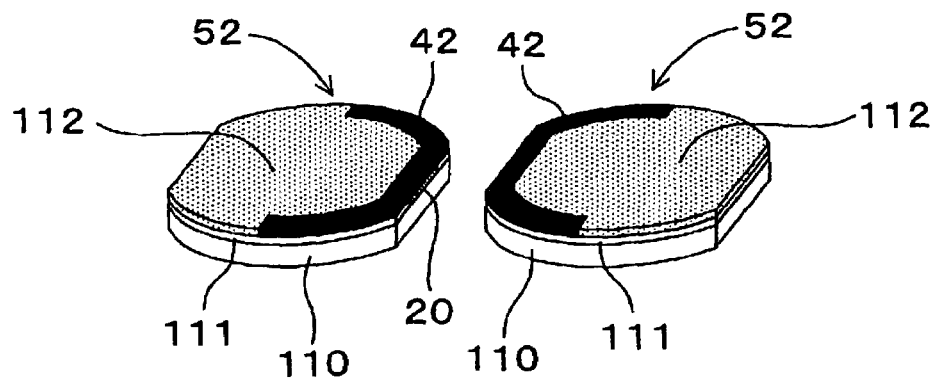
FIG. 16 shows a view illustrating sheet pieces in Example 2.

Next, in the laminating step, punching regions 50 of the green sheet 110 are punched by using a punching/laminating device (not shown) to obtain sheet pieces 52 as shown in FIG. 16.

Figure 17:
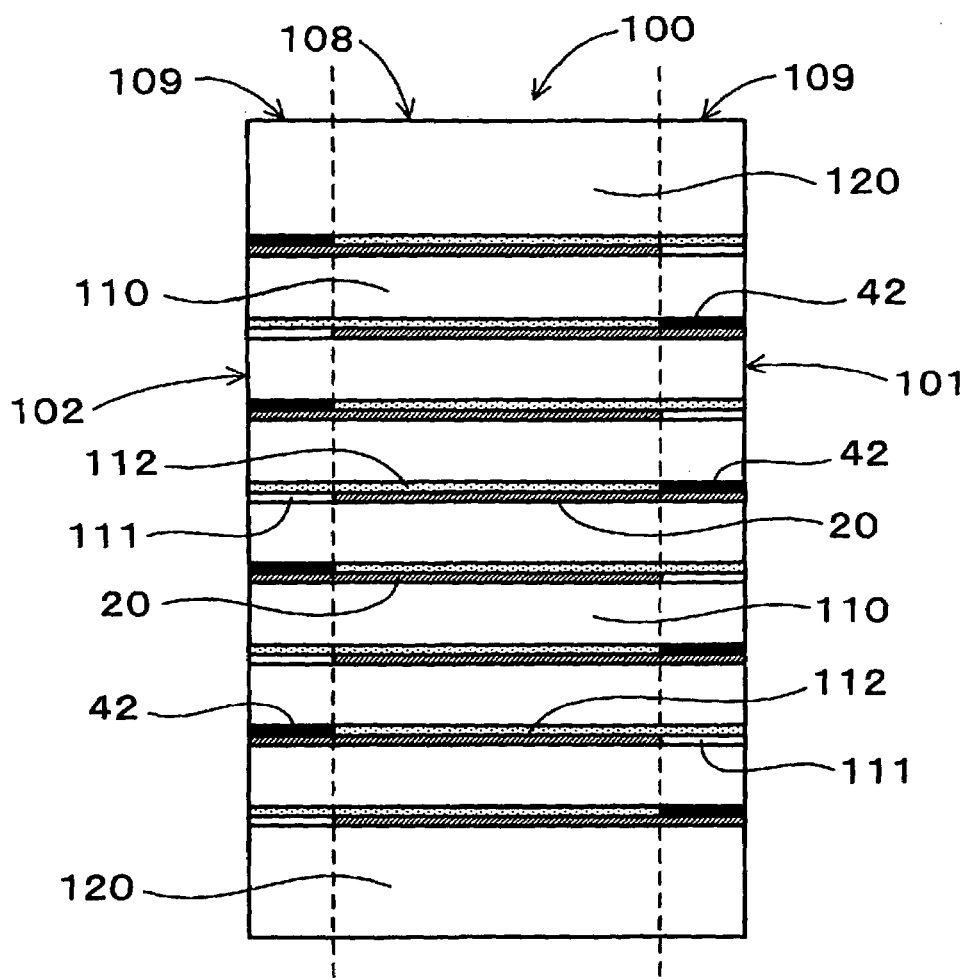
FIG. 17 shows a sectional view illustrating an intermediate laminated body in Example 2.
Figure 18:
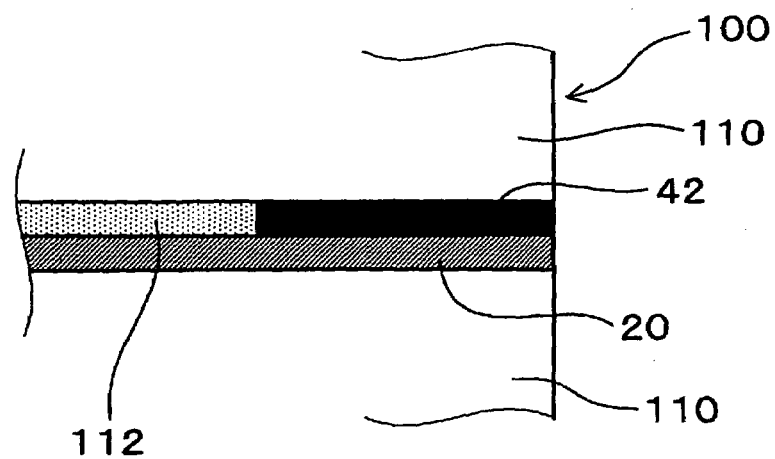
FIG. 18 shows a sectional view illustrating, on an enlarged scale, a major portion of the intermediate laminated body in Example 2.

The obtained sheet pieces 52 are so laminated that the inner electrode layers 20 exposed on the side surfaces are alternately directed. Thus, an intermediate laminated body 100 is obtained as shown in FIGS. 17 and 18.

Here, a side electrode material (not shown) for forming side electrodes is applied onto the side surfaces 101 and 102 of the intermediate laminated body 100.

<Calcining Step>

Next, in the calcining step, the intermediate laminated body 100 is heated and is degreased. After degreased, the intermediate laminated body 100 is calcined.

Figure 19:
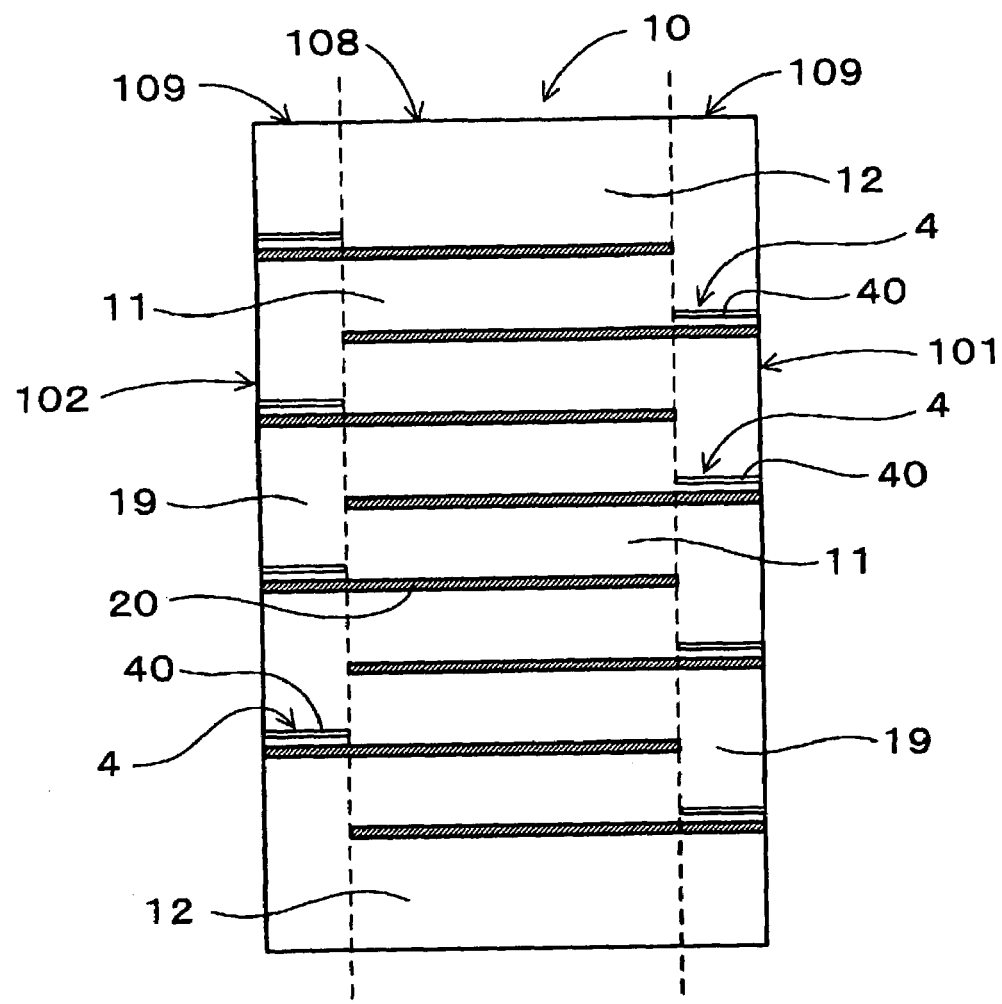
FIG. 19 shows a sectional view illustrating the internal structure of a ceramic laminated body in Example 2.
Figure 20:
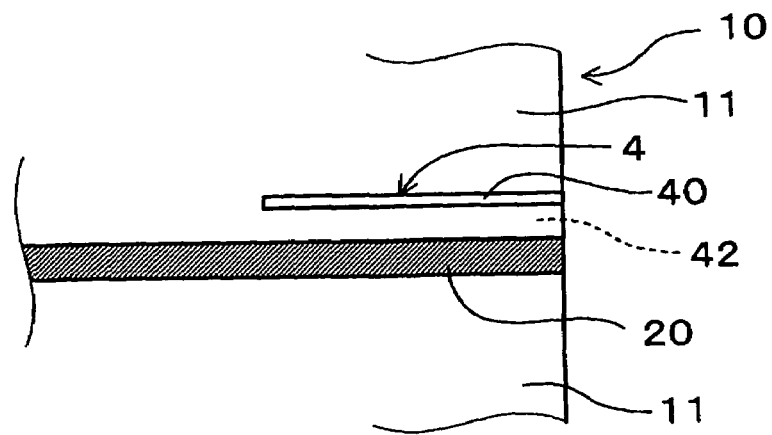
FIG. 20 shows a sectional view illustrating, on an enlarged scale, a major portion of the ceramic laminated body in Example 2.
Figure 21:
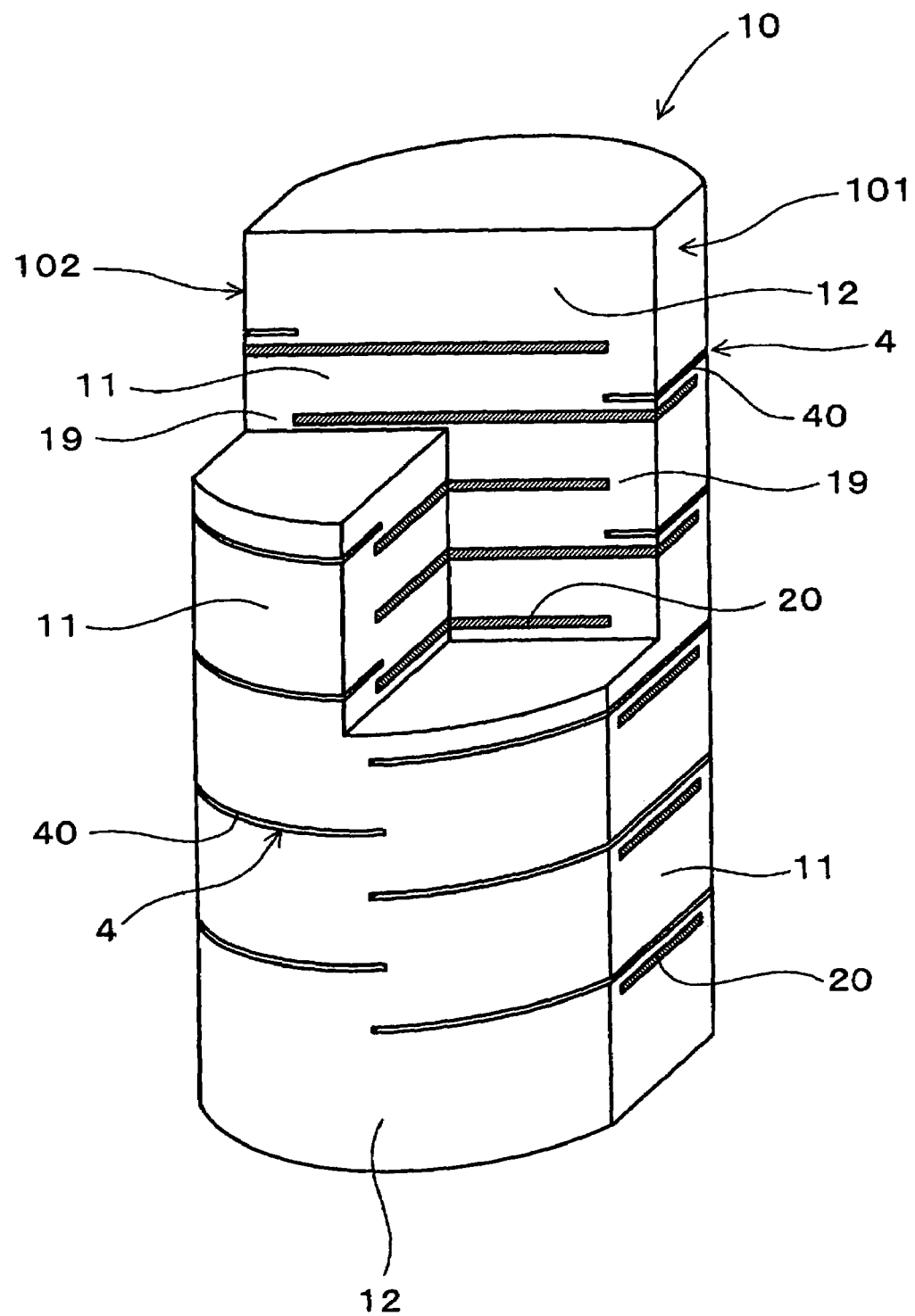
FIG. 21 shows a view illustrating the whole structure of the ceramic laminated body in Example 2.

Thus, the ceramic laminated body 10 is obtained as shown in FIGS. 19 to 21. The ceramic laminated body 10 is obtained by alternately laminating piezoelectric layers 11 and inner electrode layers 20 in the same manner as in Example 1. Further, side electrodes 30 (not shown) are formed on the side surfaces 101 and 102 of the ceramic laminated body 10.

As shown in the same drawings, further, the voids 40 are formed in the portions neighboring the material 42 for forming relaxing layers arranged in the intermediate laminated body 100 in the non-overlapped portion 109 of the ceramic laminated body 10. The voids are formed as the material 42 for forming relaxing layers contracts greatly in the neighboring portions in the calcining step. In this Example, the voids 40 (see FIG. 20) are formed between the material 42 for forming relaxing layers and the green sheet 110 laminated thereon (see FIG. 20). The relaxing layer 4 including voids 40 is formed along each of the inner electrode layers 20.

Next, after the calcining step, a step is executed for arranging a pair of outer electrodes 34 on the side surfaces 101 and 102 of the ceramic laminated body 10 like in Example 1.

Figure 22:
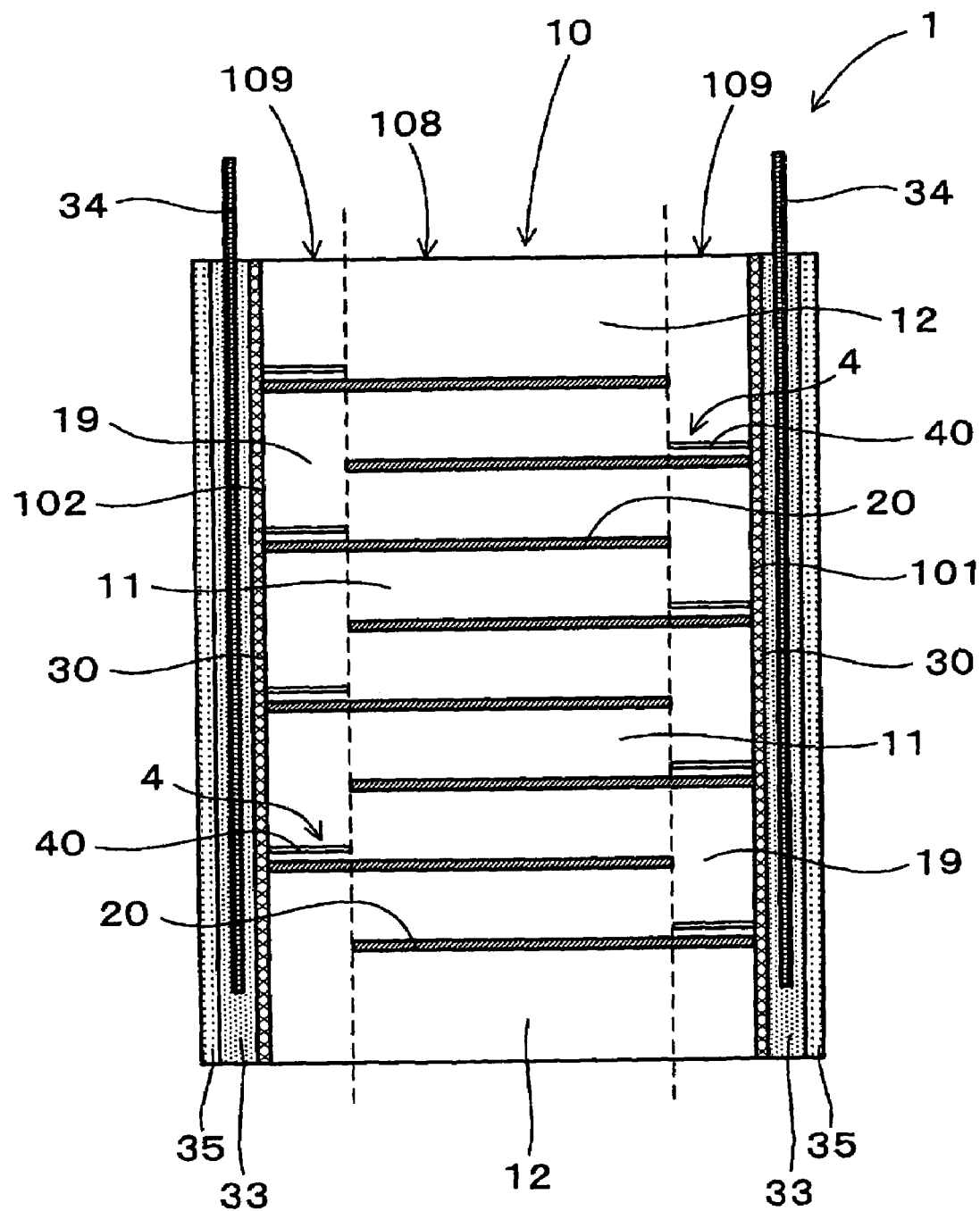
FIG. 22 shows a view illustrating the constitution of a laminate-type piezoelectric element in Example 2.

The laminate-type piezoelectric element 1 of FIG. 22 is thus obtained.

The other production methods (including materials and degreasing/calcining conditions) are the same as those of Example 1.

In the thus obtained laminate-type piezoelectric element 1, the ceramic laminated body 10 is fabricated by alternately laminating the piezoelectric layers 11 and the inner electrode layers 20 as described above and as shown in FIGS. 21 and 22. Further, the ceramic laminated body 10 has an electrode non-forming structure.

As shown in the same drawings, further, the ceramic laminated body 10 includes an overlapped portion 108 and a non-overlapped portion 109. In the non-overlapped portion 109, the relaxing layers 4 including voids 40 are formed along the inner electrode layers 20. The relaxing layers 4 are formed over one-half the outer circumferential portion of the ceramic laminated body 10. The relaxing layers 4 are further alternately formed on the side of the side surface 101 and on the side of the side surface 102.

Other fundamental constitutions are the same as those of Example 1.

Next, described below are the action and effect in the method of producing the laminate-type piezoelectric element 1 of this Example.

In the method of producing the laminate-type piezoelectric element 1 according to this Example, the material 42 for forming relaxing layers is arranged in the non-overlapped portion 109 of the intermediate laminated body 10 in the intermediate laminated body-forming step. The material 42 for forming relaxing layers has a calcining temperature lower than that of the green sheet, and contracts more in the calcining step than the green sheet 110. Thus, the material 42 for forming relaxing layers having the above properties is arranged in the intermediate laminated body 100 of before being calcined. Upon being calcined through the calcining step, the material 42 for forming relaxing layers contracts more than the neighboring portions to form voids 40. Namely, in this Example, voids 40 are formed relative to the green sheet 110 and the portion (adhesive layer 112) of substantially the same material as the green sheet 110. Thus, relaxing layers 4 including voids 40 can be easily formed in the non-overlapped portion 109 of the ceramic laminated body 10 obtained through calcining. That is, relying upon the production method of this Example, the structure can be easily formed for relaxing the stress that is caused by piezoelectric displacement.

In the production method of this Example, further, the relaxing layers 4 are formed in the non-overlapped portion 109. Therefore, stress caused by the piezoelectric displacement can be effectively dispersed and relaxed by the relaxing layers 4 including voids 40. This prevents stress from concentrating in the non-overlapped portion 109 despite of piezoelectric displacement and suppresses the occurrence of cracks and the like.

Owing to its excellent effect described above, the laminate-type piezoelectric element 1 produced by the above production method of this Example maintains its high quality and performance even after being used for extended periods of time. This accounts for its excellent durability and reliability.

In this Example, further, the intermediate laminated body-forming step includes a sheet-forming step of forming the green sheet 110, an adhesive layer-printing step of printing the material 42 for forming relaxing layers on the relaxing layer-forming portions 40 where the relaxing layers 4 are to be formed in the portion that becomes the non-overlapped portion 109, and a laminating step of laminating the green sheets 110. Therefore, the voids 40 can be easily and reliably formed in the portions neighboring the material 42 for forming relaxing layers, i.e., between the material 42 for forming relaxing layers and the green sheet 110 or the adhesive layer 112 in the ceramic laminated body 10 after the calcining.

Both the adhesive layer 112 and the material 42 for forming relaxing layers contain the same ceramic starting powder as a main component, and an average particle size A of the ceramic starting powder contained in the adhesive layer 112 and an average particle size B of the ceramic starting powder contained in the material 42 for forming relaxing layers, satisfy a relationship $A > 1.05 \times B$. Therefore, voids 40 and relaxing layers 4 including voids 40 can be reliably formed in the portions neighboring the material 42 for forming relaxing layers.

The average particle size A of the ceramic starting powder contained in the adhesive layer 112 is 0.5 μm and the average particle size B of the ceramic starting powder contained in the material 42 for forming relaxing layers is 0.3 μm. Therefore, the voids 40 can be sufficiently and reliably formed in the ceramic laminated body 10 after calcining. Thus, the relaxing layers 4 exhibit the effect of relaxing stress sufficiently and reliably.

According to the production method of this Example as described above, the structure can be easily formed for relaxing the stress caused by the piezoelectric displacement as in Example 1. The laminate-type piezoelectric element produced by the above production method exhibits excellent durability and reliability.

In the ceramic laminated body 10, the positions and shapes of the relaxing layers 4 can be varied depending upon the positions and shape of the material 42 for forming relaxing layers arranged at the time of fabricating the intermediate laminated body 100. In this Example, the relaxing layer 4 is formed along every inner electrode layer 20. However, the relaxing layer 4 may be formed along every fourth inner electrode layer 20 (see FIG. 14) or may be formed at various other positions. In this Example, further, the relaxing layers 4 are formed over a half of the outer circumference of the ceramic laminated body 10. The relaxing layers 4, however, may be formed along the whole circumference or may be formed on the side surfaces 101 and 102 only.

Example 3

This Example is concerned with a method of producing the laminate-type piezoelectric element 1 of Example 1 and wherein the relaxing layers 4 including voids 40 are formed at intermediate positions among the inner electrode layers 20. The contents thereof will be described with reference to the drawings.

Figure 23:
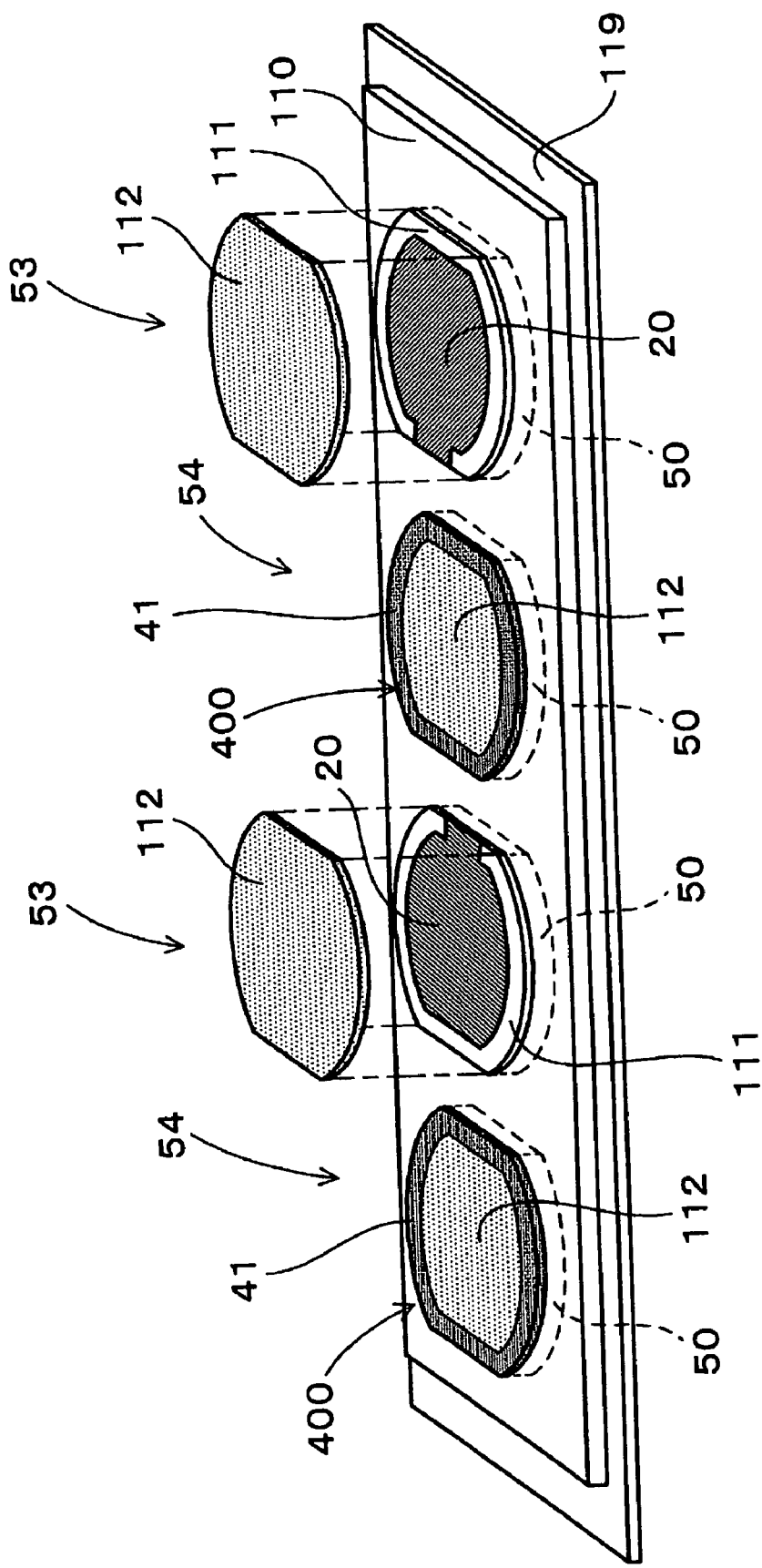
FIG. 23 shows a view illustrating the steps of printing inner electrode layers, spacer layers and adhesive layers in Example 3.

In the electrode-printing step and in the adhesive layer-printing step of this Example as shown in FIG. 23, an inner electrode layer 20, a spacer layer 111 and an adhesive layer 112 are printed on the punching regions 50 of the green sheet 110 in order to obtain two kinds of sheet pieces, i.e., an electrode-including sheet piece 53 on which the inner electrode layer 20 is printed and a relaxing layer-forming sheet piece 54 for forming the relaxing layer 4.

As shown, the inner electrode layer 20 and the spacer layer 111 are screen-printed on the punching regions 50 of the green sheet 110 for forming the electrode-including sheet pieces 53. The adhesive layer 112 is screen-printed on the inner electrode layer 20 and on the spacer layer 111.

The adhesive layer 112 is screen-printed on the punching regions 50 of the green sheet 110 of the sheet pieces 54 that form relaxing layers. Here, a non-printed portion-forming layer 41 of the same constitution as that of Example 1 is formed on the relaxing layer-forming portion 400. The relaxing layer-forming portion 400 of this Example is a portion that becomes the non-overlapped portion 109, i.e., is the whole outer circumferential portion of the punching region 50.

Next, in the laminating step, punching regions 50 of the green sheet 110 are punched by using a punching/laminating device (not shown) to obtain electrode-including sheet pieces 53 and sheet pieces 54 for forming relaxing layers (see FIG. 23).

Figure 24:
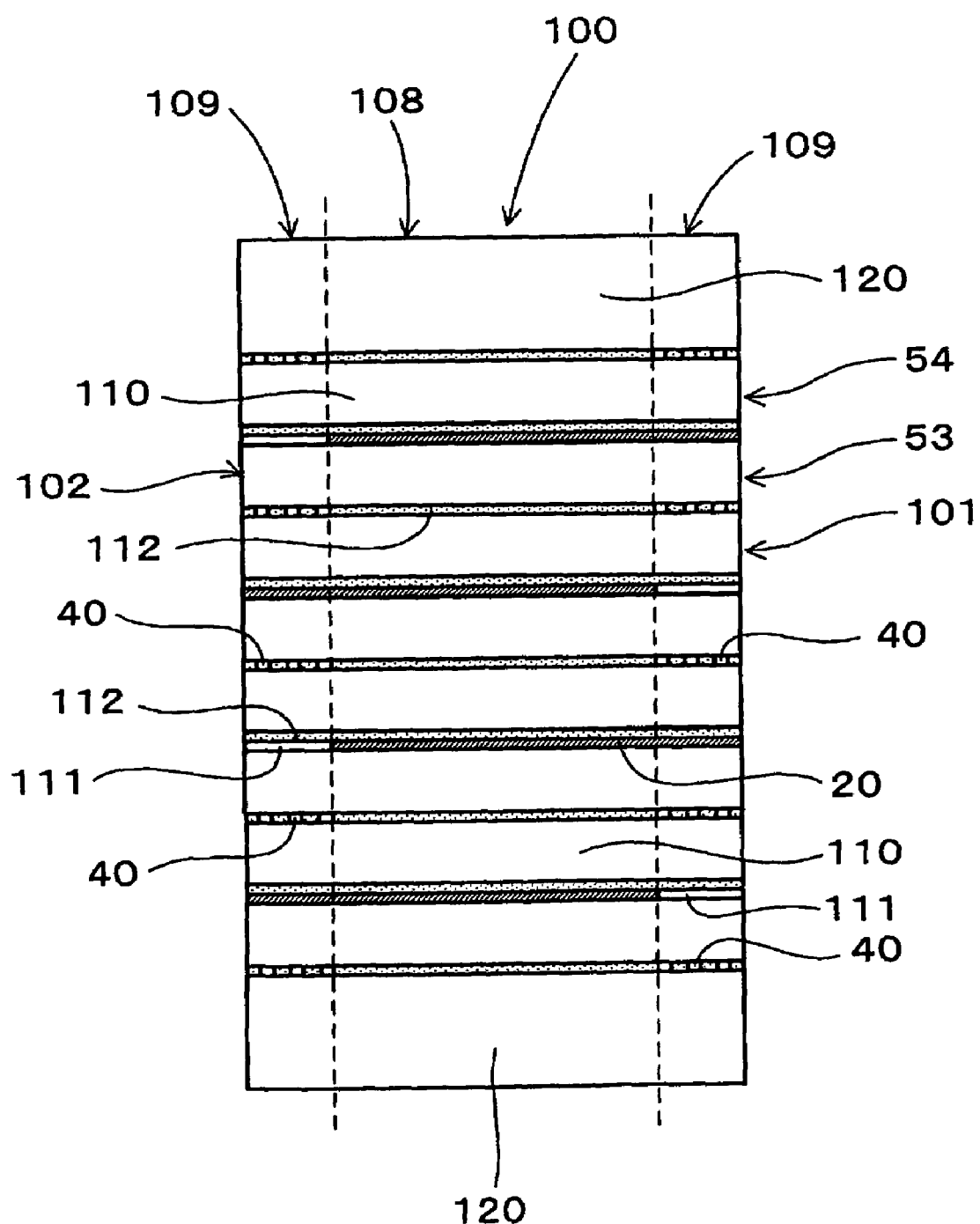
FIG. 24 shows a sectional view illustrating an intermediate laminated body in Example 3.

The two kinds of sheet pieces 53 and 54 that are obtained are alternately laminated. The electrode-including sheet pieces 53 are so laminated that the inner electrode layers 20 exposed on the side surfaces are alternately directed. Thus, an intermediate laminated body 100 is obtained as shown in FIG. 24.

Figure 25:
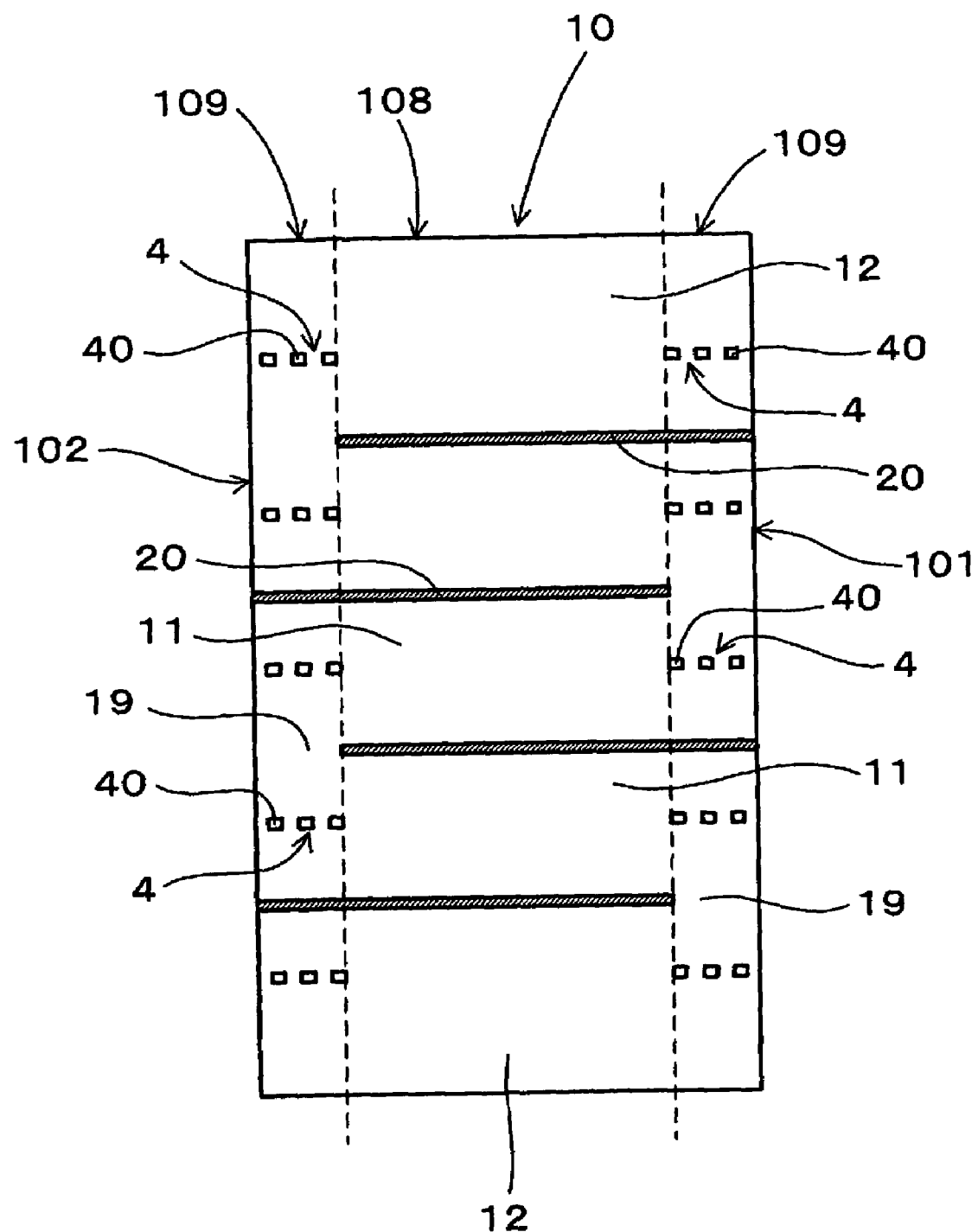
FIG. 25 shows a sectional view illustrating a ceramic laminated body in Example 3.
Figure 26:
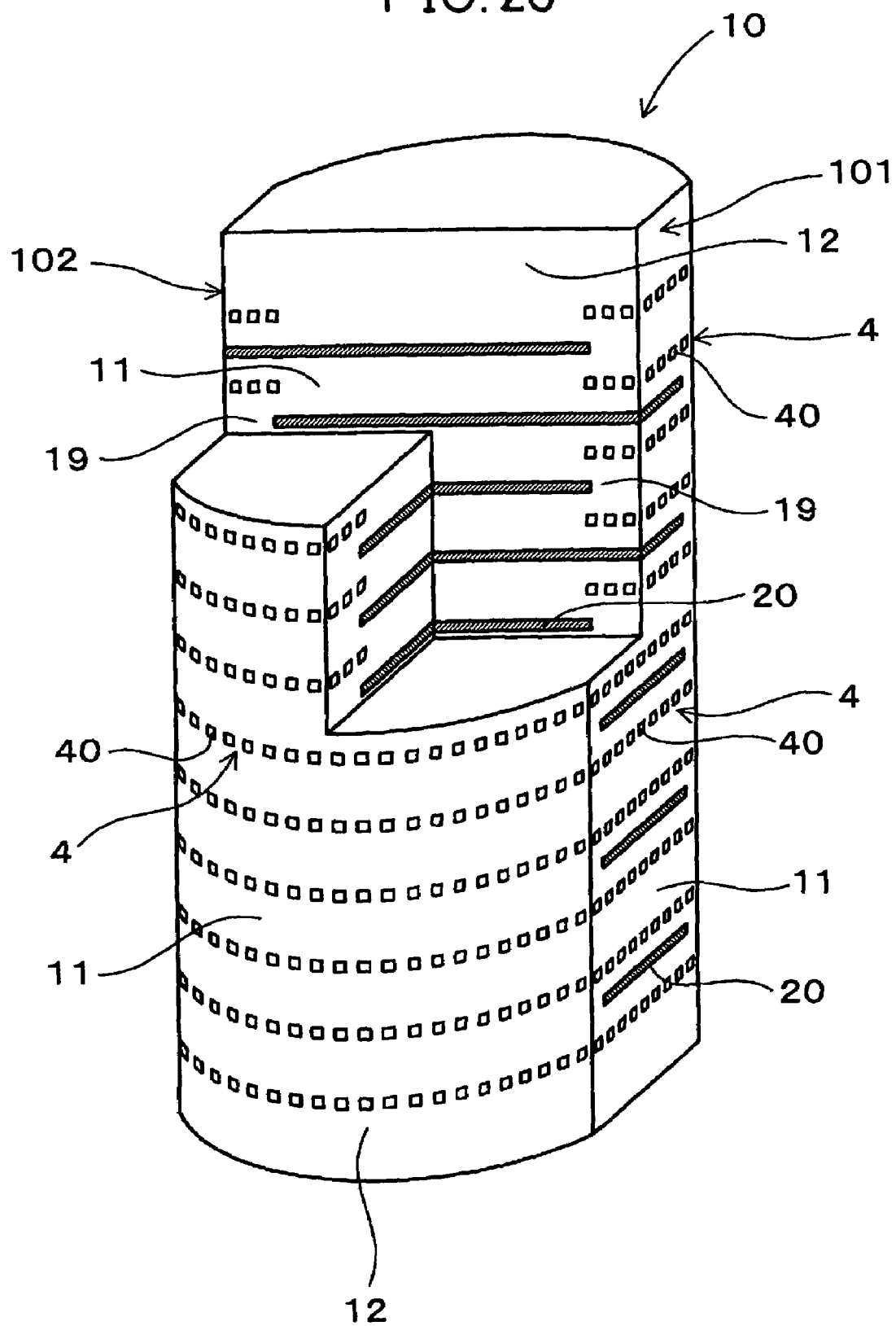
FIG. 26 shows is a view illustrating the whole structure of the ceramic laminated body in Example 3.

Next, in the calcining step, the intermediate laminated body 100 is degreased and is calcined to obtain the ceramic laminated body 10 as shown in FIGS. 25 and 26.

After the calcining step, the same steps as those of Example 1 are executed to obtain the laminate-type piezoelectric element 1.

The other production methods are the same as those of Example 1.

In the thus obtained laminate-type piezoelectric element 1, the ceramic laminated body 10 has the relaxing layers 4 including voids 40 formed at intermediate positions among the inner electrode layers 20 as shown in FIGS. 25 and 26. The relaxing layers 4 are formed along the entire outer circumference of the ceramic laminated body 10.

Other basic constitutions are the same as those of Example 1.

In this case, the relaxing layers 4 including voids 40 are formed at intermediate positions among the inner electrode layers 20. Further, the relaxing layers 4 are formed over the whole outer circumference of the ceramic laminated body 10. Therefore, the relaxing layers 4 exhibit further improved effect for relaxing stress.

The action and effect in regard to other respects are the same as those of Example 1.

Figure 27:
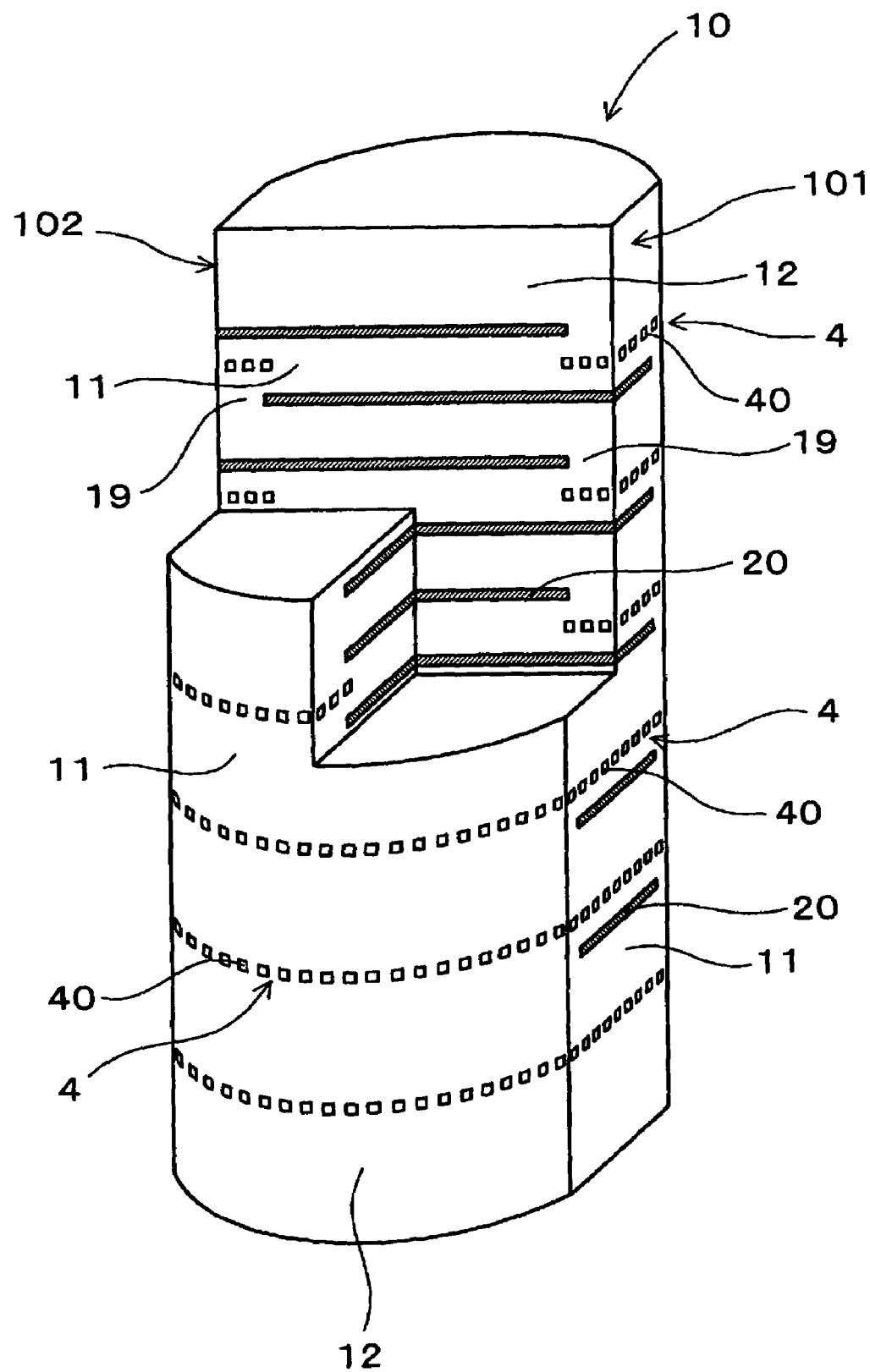
FIG. 27 shows a view illustrating an example of varying the positions of relaxing layers in the ceramic laminated body in Example 3.

In this Example, the relaxing layers 4 are formed at intermediate positions among the inner electrode layers 20. As shown in FIG. 27, however, the relaxing layers 4 can be formed at intermediate positions among every other inner electrode layers 20 or at various other positions.

Example 4

This Example is concerned with a method of producing the laminate-type piezoelectric element 1 of Example 1 wherein the relaxing layers 4 including voids 40 are formed at intermediate positions among the inner electrode layers 20. The method will be described with reference to the drawings.

Figure 28:
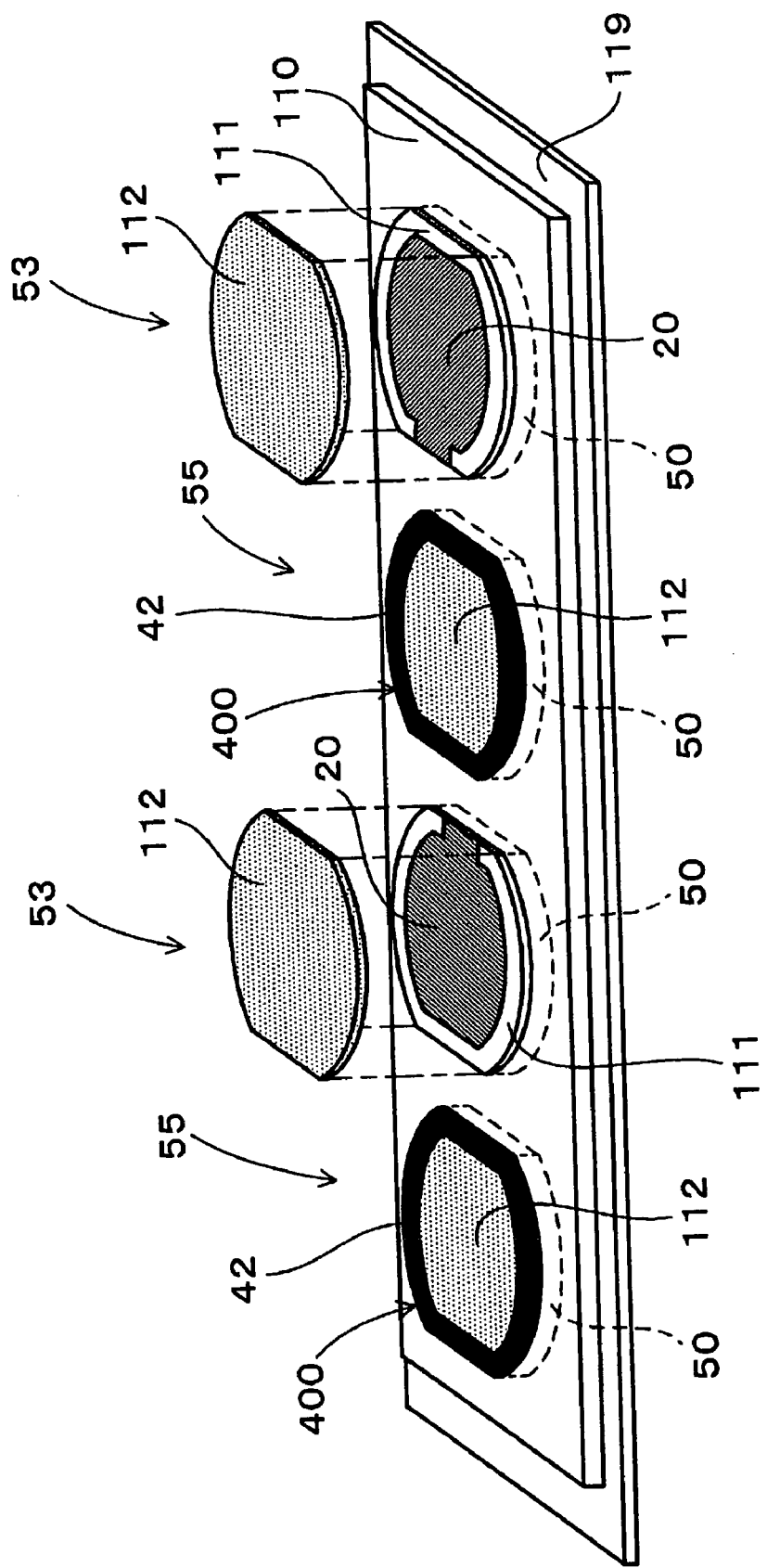
FIG. 28 shows a view illustrating the steps of printing inner electrode layers, spacer layers and adhesive layers in Example 4.

In the electrode-printing step and in the adhesive layer-printing step of this Example, as shown in FIG. 28, an inner electrode layer 20, a spacer layer 111, an adhesive layer 112 and a material 42 for forming relaxing layers are printed on the punching regions 50 of the green sheet 110 in order to obtain two kinds of sheet pieces, i.e., an electrode-including sheet piece 53 on which the inner electrode layer 20 is printed and a relaxing layer-forming sheet piece 54 on which the material 42 for forming relaxing layers is printed.

As shown, the inner electrode layer 20, the spacer layer 111 and the adhesive layer 112 are screen-printed on the punching regions 50 of the green sheet 110 for forming the electrode-including sheet pieces 53.

The adhesive layer 112 is screen-printed on the punching regions 50 of the green sheet 110 for the sheet pieces 54 for forming relaxing layers and, besides, the material 42 for forming relaxing layers is screen-printed on the relaxing layer-forming portions 400. Here, the relaxing layer-forming portion 400 of this Example is a portion that becomes the non-overlapped portion 109, i.e., is the whole circumferential portion of the punching region 50.

Next, in the laminating step, punching regions 50 of the green sheet 110 are punched by using a punching/laminating device (not shown) to obtain electrode-including sheet pieces 53 and sheet pieces 55 for forming relaxing layers (see FIG. 28).

Figure 29:
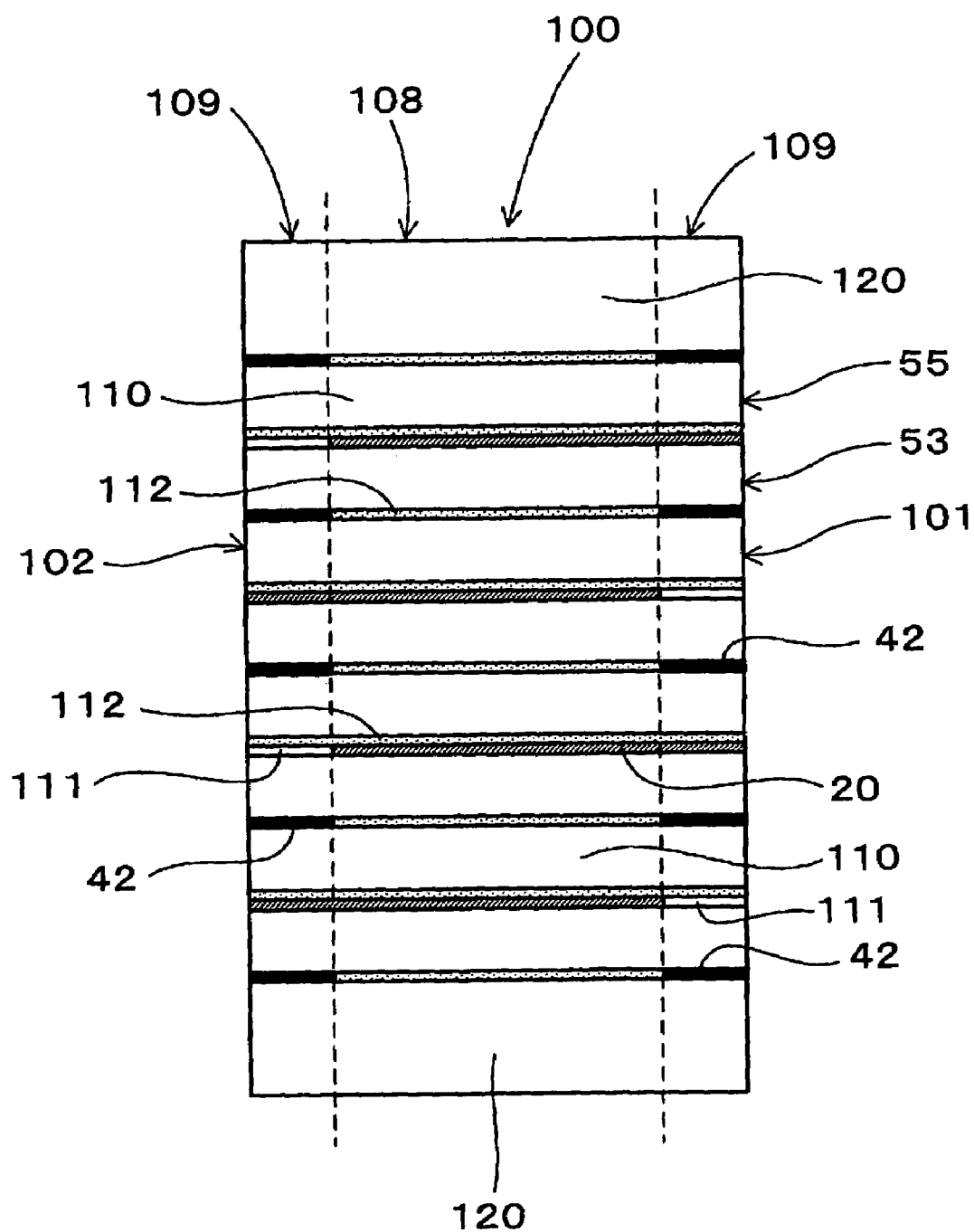
FIG. 29 shows a sectional view illustrating an intermediate laminated body in Example 4.

The two kinds of sheets 53 and 55 that are obtained are alternately laminated. The electrode-including sheet pieces 53 are so laminated that the inner electrode layers 20 exposed on the side surfaces are alternately directed. Thus, an intermediate laminated body 100 is obtained as shown in FIG. 29.

Figure 30:
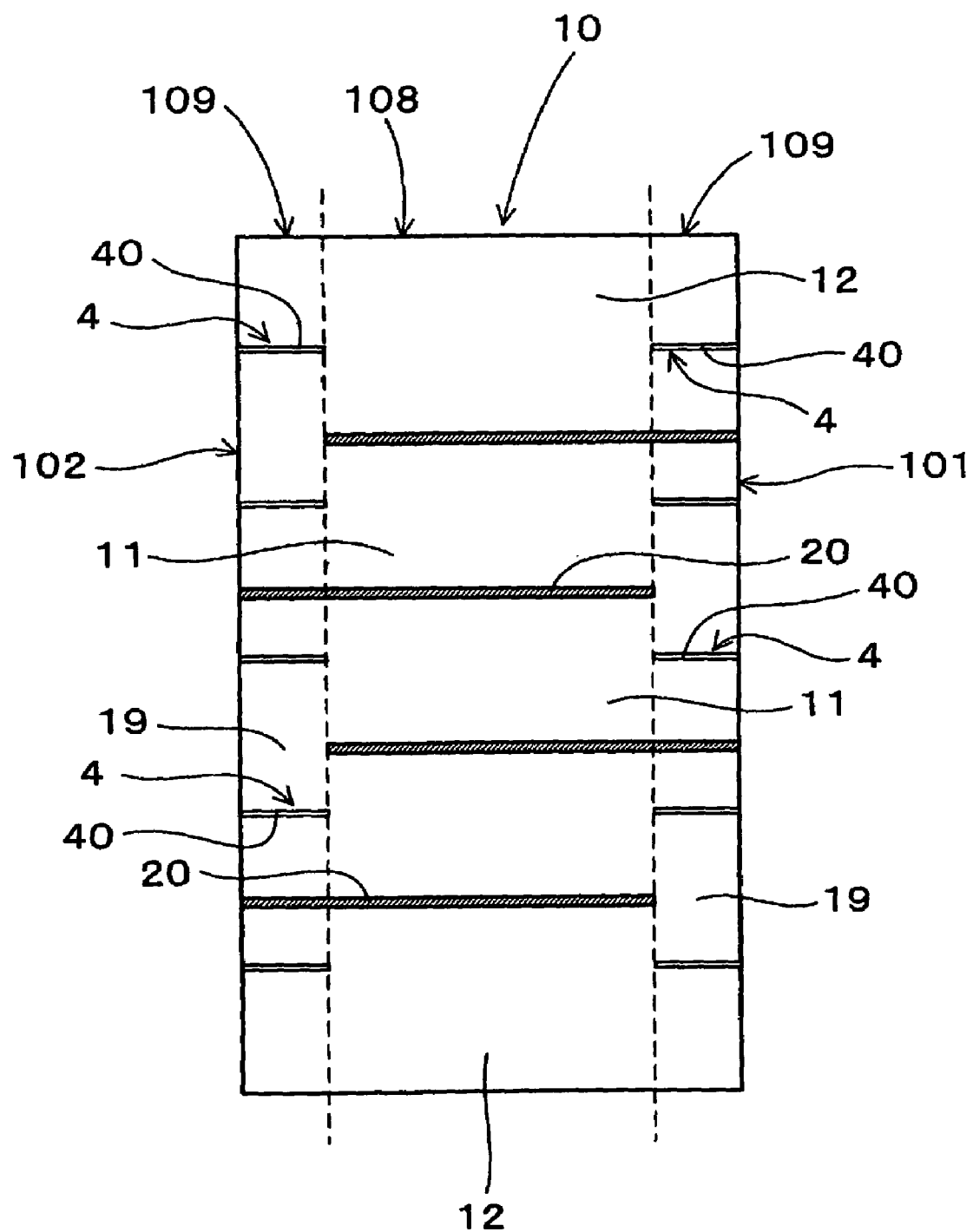
FIG. 30 shows a sectional view illustrating a ceramic laminated body in Example 4.
Figure 31:
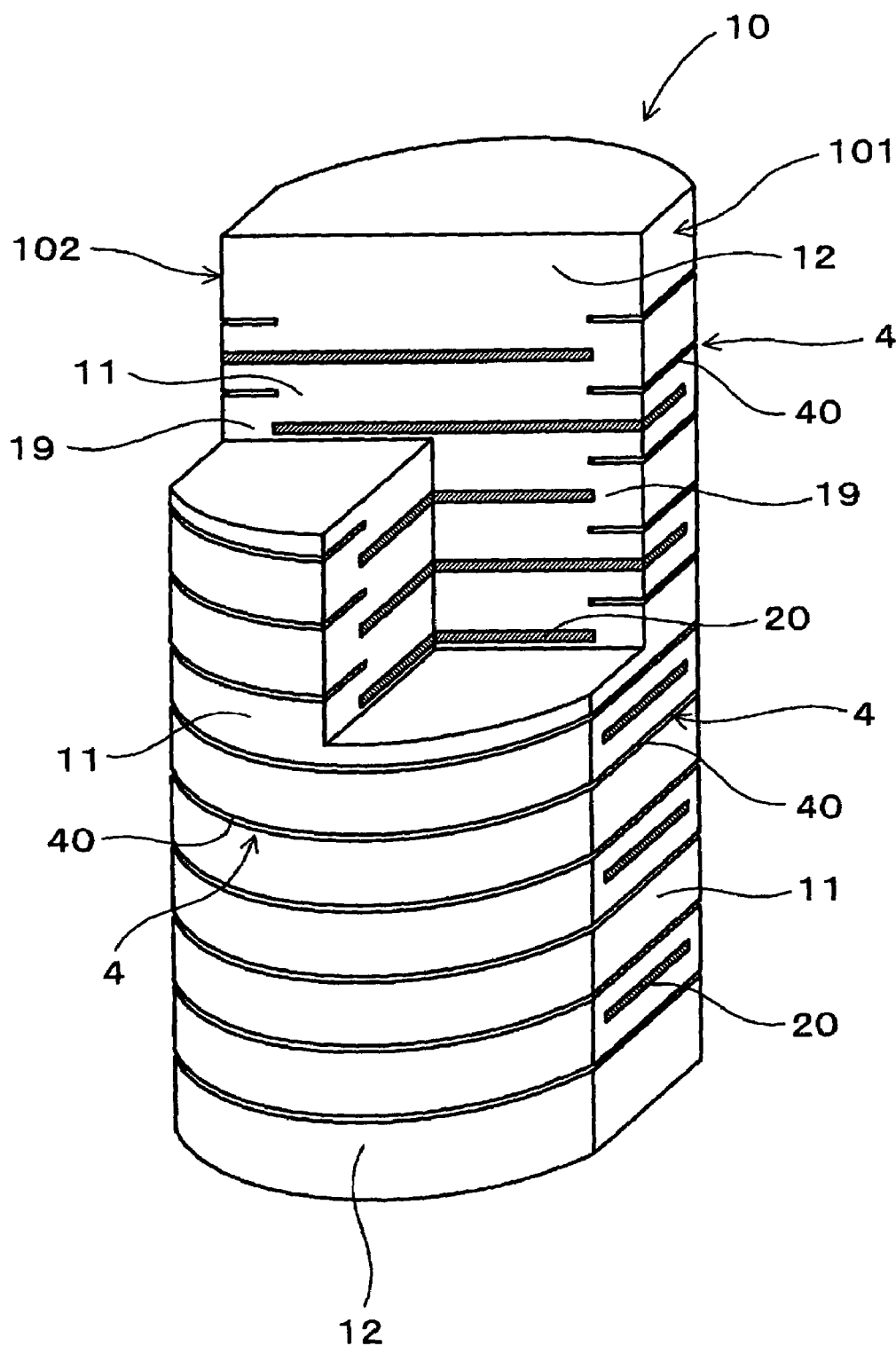
FIG. 31 shows a view illustrating the whole structure of the ceramic laminated body in Example 4.

Next, in the calcining step, the intermediate laminated body 100 is degreased and is calcined to obtain the ceramic laminated body 10 as shown in FIGS. 30 and 31.

After the calcining step, the same steps as those of Example 2 are executed to obtain the laminate-type piezoelectric element 1.

The other production methods are the same as those of Example 2.

In the thus obtained laminate-type piezoelectric element 1, the ceramic laminated body 10 has the relaxing layers 4 including voids 40 formed at intermediate positions among the inner electrode layers 20 as shown in FIGS. 30 and 31. The relaxing layers 4 are formed along the whole outer circumference of the ceramic laminated body 10.

Other basic constitutions are the same as those of Example 2.

In this case, the relaxing layers 4 including voids 40 are formed at intermediate positions among the inner electrode layers 20. Further, the relaxing layers 4 are formed over the whole outer circumference of the ceramic laminated body 10. Therefore, the relaxing layers 4 exhibit further improved effect for relaxing stress.

The action and effect in regard to other respects are the same as those of Example 2.

In this Example, the relaxing layers 4 are formed at intermediate positions among the inner electrode layers 20. However, the relaxing layers 4 can be formed at intermediate positions among every other inner electrode layers 20 (see FIG. 27) or at various other positions.

Example 5

This is an Example of using the laminate-type piezoelectric element 1 produced by the method of Examples 1 to 4 as a piezoelectric actuator of an injector 6.

Figure 32:
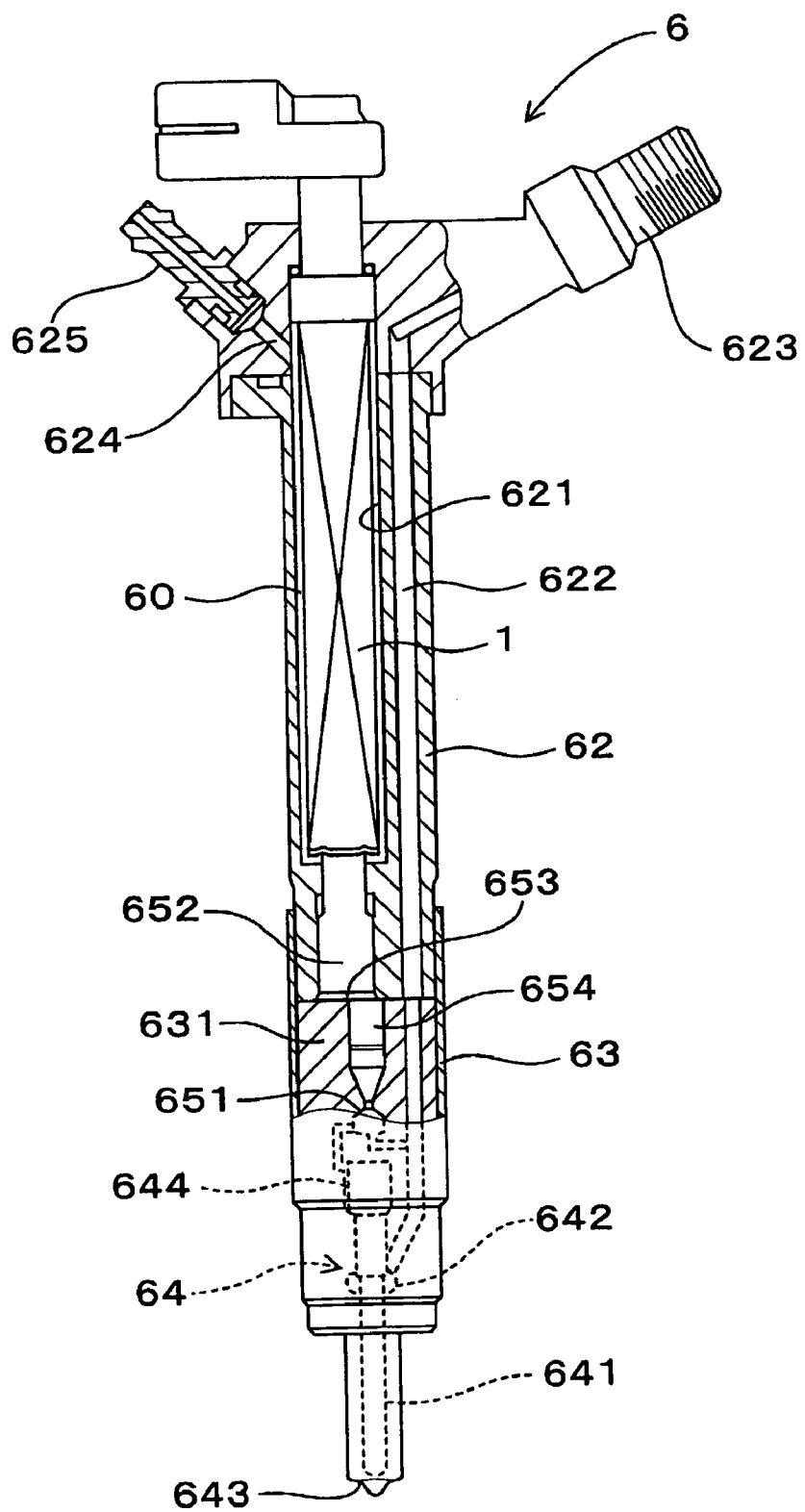
FIG. 32 shows a view illustrating the structure of an injector in Example 5.

The injector 6 of this Example is, as shown in FIG. 32, applied to a common rail-type injection system of a diesel engine.

The injector 6 has, as shown, an upper housing 62 accommodating the laminate-type piezoelectric element 1 as a driving part, and a lower housing 63 fixed to the lower end of the upper housing and forming an injection nozzle portion 64 therein.

The upper housing 62 is approximately in a shape of a circular cylinder, and the laminate-type piezoelectric element 1 is inserted and fixed inside a longitudinal hole 621 therein which is deviated from the center axis.

A high-pressure fuel passage 622 is provided by the side of the longitudinal hole 621 in parallel therewith, and the upper end thereof is communicated with an external common rail (not shown) through a fuel introduction pipe 623 that protrudes at the upper side portion of the upper housing 62.

A fuel outflow pipe 625 is protruding from an upper side portion of the upper housing 62 so as to be communicated with a drain passage 624, and the fuel flowing out from the fuel outflow pipe 625 is returned back to a fuel tank (not shown).

The drain passage 624 passes through a gap 60 between the longitudinal hole 621 and the driving part (laminate-type piezoelectric element) 1, and is communicated with a three-way valve 651 through a passage (not shown) extending downward from the gap 60 through the upper and lower housings 62 and 63.

The injection nozzle portion 64 is provided with a nozzle needle 641 that slides up and down in a piston body 631, and an injection port 643 that is opened and closed by the nozzle needle 641 and injects the high-pressure fuel supplied from a fuel reservoir 642 to each cylinder of the engine. The fuel reservoir 642 is provided around the nozzle needle 641 at an intermediate portion thereof and where the lower end of the high-pressure fuel passage 622 opens. The nozzle needle 641 receives the fuel pressure from the fuel reservoir 642 in a direction in which the valve opens and also receives the fuel pressure in a direction in which the valve closes from a back pressure chamber 644 which is provided facing the upper end thereof. When the pressure in the back pressure chamber 644 decreases, the nozzle needle 641 is lifted up whereby the injection port 643 opens and the fuel is injected.

The pressure in the back pressure chamber 644 is increased or decreased by the three-way valve 651. The three-way valve 651 is so constituted as to selectively communicate the back pressure chamber 644 with the high-pressure fuel passage 622 or with the drain passage 624. A ball-like valve body is used here to make a communication with the high-pressure fuel passage 622 or with the drain passage 624. The valve body is driven by the driving part 1 via a piston 652 of a large diameter, a hydraulic chamber 653 and a piston 654 of a small diameter which are arranged thereunder.

In this Example, the laminate-type piezoelectric element 1 produced by the method of Examples 1 to 4 is used as the driving source in the injector 6 constituted as described above. The laminate-type piezoelectric element 1 has excellent durability and reliability as described above. Therefore, performance of the injector 6 as a whole can be enhanced.

The invention claimed is:

1. A method of producing a laminate-type piezoelectric element having a ceramic laminated body obtained by alternately laminating piezoelectric layers made of a piezoelectric material and inner electrode layers having electrically conducting property, and having outer electrodes arranged on the side surfaces of said ceramic laminated body, wherein said ceramic laminated body is formed through:

an intermediate laminated body-forming step of forming an intermediate laminated body by alternately laminating green sheets that serve as the piezoelectric layers and the inner electrode layers; and a calcining step of forming said ceramic laminated body by calcining said intermediate laminated body; and wherein, in said intermediate laminated body-forming step, there are formed an overlapped portion which is a region where the inner electrode layers are all overlapped one upon the other, and a non-overlapped portion which is a region where only some of the inner electrode layers are overlapped, or none of the inner electrode layers are overlapped at all when said intermediate laminated body is viewed in the direction of lamination, and voids are formed in advance in at least part of the non-overlapped portion, and in said calcining step, relaxing layers including said voids are formed.

2. A method of producing a laminate-type piezoelectric element according to claim 1, wherein said intermediate laminated body-forming step includes:

a sheet-forming step of forming said green sheet;

an adhesive layer-printing step of printing an adhesive layer of the same material as said green sheet on the surface of the uppermost green sheet, and of forming printed portions on which said adhesive layer is printed, and non-printed portions on which said adhesive layer is not printed, in the relaxing layer-forming portions where said relaxing layers are formed in the portion that becomes the non-overlapped portion; and a laminating step of laminating said green sheets and forming said voids comprising said non-printed portions between said green sheets.

3. A method of producing a laminate-type piezoelectric element according to claim 2, wherein, after said sheet-forming step, an electrode-printing step is executed to print said inner electrode layer on said green sheet and to print a spacer layer of a thickness nearly equal to that of said inner electrode layer neighboring the region where said inner electrode layer is printed, and in said adhesive layer-printing step, said adhesive layer is printed on said inner electrode layer and on said spacer layer.

4. A method of producing a laminate-type piezoelectric element according to claim 2, wherein in said adhesive layer-printing step, the area of a portion for providing the non-printed portions is 20 to 65% of the area of said relaxing layer-forming portion on the same plane.

5. A method of producing a laminate-type piezoelectric element according to claim 2, wherein in said adhesive layer-printing step, a plurality of mini-blocks comprising the adhesive layer are printed maintaining a gap as said printed portions on said relaxing layer-forming portions, and said non-printed portions are provided between said mini-blocks.

6. A method of producing a laminate-type piezoelectric element according to claim 5, wherein in said adhesive layer-printing step, said mini-blocks are printed being arranged regularly or at random.

7. A method of producing a laminate-type piezoelectric element according to claim 1, wherein said laminate-type piezoelectric element is a piezoelectric actuator for an injector and is used as a drive source of the injector.

* * * * *